United States Patent
Endo

(10) Patent No.: US 9,029,969 B2
(45) Date of Patent: May 12, 2015

(54) IMAGING ELEMENT, IMAGE PICKUP APPARATUS, MANUFACTURING APPARATUS AND MANUFACTURING METHOD

(75) Inventor: Suzunori Endo, Kumamoto (JP)

(73) Assignee: Sony Corporation, Tokyo (JP)

( * ) Notice: Subject to any disclaimer, the term of this patent is extended or adjusted under 35 U.S.C. 154(b) by 241 days.

(21) Appl. No.: 13/584,244

(22) Filed: Aug. 13, 2012

(65) Prior Publication Data

US 2013/0076951 A1   Mar. 28, 2013

(30) Foreign Application Priority Data

Sep. 26, 2011 (JP) .................................. 2011-208512

(51) Int. Cl.
| | |
|---|---|
| *H01L 27/146* | (2006.01) |
| *H01L 27/148* | (2006.01) |
| *H01L 21/00* | (2006.01) |
| *H04N 5/361* | (2011.01) |

(52) U.S. Cl.
CPC ............ *H04N 5/361* (2013.01); *H01L 27/1464* (2013.01); *H01L 27/14687* (2013.01); *H01L 27/14689* (2013.01)

(58) Field of Classification Search
USPC .......................................... 257/435; 438/75
See application file for complete search history.

(56) References Cited

U.S. PATENT DOCUMENTS

| | | | | |
|---|---|---|---|---|
| 2005/0062118 | A1* | 3/2005 | Yaung et al. ................... | 257/414 |
| 2007/0290245 | A1* | 12/2007 | Unagami et al. .............. | 257/294 |
| 2010/0289935 | A1* | 11/2010 | Ohno ............................ | 348/306 |
| 2011/0102620 | A1* | 5/2011 | Sakano et al. .............. | 348/222.1 |
| 2012/0012961 | A1* | 1/2012 | Kataoka et al. ................ | 257/432 |
| 2012/0043636 | A1* | 2/2012 | Nagata ........................ | 257/435 |
| 2012/0049305 | A1* | 3/2012 | Takami et al. ................ | 257/432 |

* cited by examiner

*Primary Examiner* — Matthew Landau
*Assistant Examiner* — Igwe U Anya
(74) *Attorney, Agent, or Firm* — Oblon, McClelland, Maier & Neustadt, L.L.P.

(57) ABSTRACT

There is provided an imaging element including a transmission channel region provided in an optical black pixel region shielded from light from an outside of a semiconductor substrate by a light shielding film, for transmitting a charge existing inside the semiconductor substrate of the optical black pixel region to an outside of the optical black pixel region.

12 Claims, 23 Drawing Sheets

IMAGING ELEMENT, IMAGE PICKUP APPARATUS, MANUFACTURING APPARATUS AND MANUFACTURING METHOD

BACKGROUND

The present disclosure relates to an imaging element, an image pickup apparatus, a manufacturing apparatus and a manufacturing method, and particularly to an imaging element, an image pickup apparatus, a manufacturing apparatus and a manufacturing method capable of accurately detecting a black level reference value.

In general, an image pickup apparatus used for a digital camera and a camcoder has an effective pixel region in which pixels outputting signals for forming an image and pixels shielded from light beams by a light shielding film, that is, optical black (herein after abbreviated as OB (Optical Black)) pixels. Because an output signal from the OB pixel serves as a dark signal reference, it is preferred that the OB pixel has a dark current equivalent to that of the effective pixel and deviation of the output signal caused by incident light beams in the image pickup apparatus does not occur. In the video camera and the digital still camera, an imaging element such as a CCD (Charge Coupled Device) image sensor and a CMOS (Complementary Metal Oxide Semiconductor) image sensor is widely used.

Sensitivity improvement is an important issue common to those imaging elements, and sensitivity improvement technology by using a back side illumination CMOS image sensor was developed as one solution (See e.g., Japanese Patent Laid-Open No. 2009-176951).

In the back side illumination CMOS image sensor, the OB pixels are formed on the outer side of an effective pixel region like a front side illumination CMOS image sensor and the same sensor structure as that in the effective pixel region is used except shielded by a light shielding film. And a dummy pixel region is generally formed between the OB pixels and a peripheral circuit for the purpose of figure uniformity of a color filter and a condenser lens.

However, in the back side illumination CMOS image sensor, diffraction of long wavelength light beams is prone to occur in the OB region because of its structure. In the case of the front side illumination CMOS image sensor in the past, because a Sub substrate region existing deeper than a silicon (Si) photoelectric conversion region has a sufficient film thickness, it was unlikely that long-wavelength-band incident light beams enter the OB region. On the other hand, in the case of the back side illumination CMOS image sensor, because a silicon (Si) film thickness of the photoelectric conversion region is thin, the incident light beams were prone to be repeatedly reflected among an Si-wiring layer interface, a wiring and a further lower layer until photoelectrically converted.

During being reflected, because a certain amount of the light beams is incident in the OB region, long-wavelength light beams were likely to be incident at higher rate in the OB region in the back side illumination CMOS image sensor in comparison with the front side illumination CMOS image sensor.

When long-wavelength light beams enter the OB region and electrically converted, black level false recognition is likely to occur to cause a coloring defect in an image, so that it is desirable to reduce the incident light beams as much as possible.

Various technologies have been devised in order to inhibit unnecessary charge from entering the OB pixel to stabilize an output signal of the OB pixel when light beams are incident. In one of the technologies, formation of the OB pixel without detecting unnecessary light beams with maintaining the level of the dark signal reference by reduction of area of the photoelectric conversion region of the OB pixel, that is, reduction of sensitivity was suggested (See e.g., Japanese Patent Laid-Open No. 2006-344888).

SUMMARY

However, though applying the technology disclosed in Japanese Patent Laid-Open No. 2006-344888 to the back side illumination CMOS image sensor, it was difficult to reduce sensitivity to long-wavelength light beams.

It is because an electron generated with a minute probability at a P-type region can escape to an Nsub region of a silicon substrate in the front side illumination CMOS image sensor but because the back side illumination CMOS image sensor has no Nsub region in the silicon substrate, the electron losing an escape route was likely to flow into a photodiode in the OB region for stabilization.

In view of the above-described problems, it is desirable to inhibit an occurrence of an error due to diffraction of light beams thereby to more accurately detect the black level reference value.

According to an embodiment of the present disclosure, there is provided an imaging element, including a transmission channel region provided in an optical black pixel region shielded from light from an outside of a semiconductor substrate by a light shielding film, for transmitting a charge existing inside the semiconductor substrate of the optical black pixel region to an outside of the optical black pixel region.

The transmission channel region may be an N-type region.

The transmission channel region may be formed so as not to touch a photoelectric conversion element provided in the optical black pixel region.

The photoelectric conversion element provided in the optical black pixel region may be formed near a boundary face of the semiconductor substrate to be thinner than a photoelectric conversion element provided in an effective pixel region.

A potential gradient may be formed in the transmission channel region such that potential lowers along a horizontal direction from an inside of the optical black pixel region toward the outside of the optical black pixel region.

The transmission channel region may be formed so as to transmit the charge to a photoelectric conversion element of a pixel in a dummy pixel region whose pixel output is not used and disposed next to the optical black pixel region.

The dummy pixel region may be disposed on an outer side of the optical black pixel region of the imaging element.

The dummy pixel region may be disposed on an inner side of the optical black pixel region of the imaging element.

The imaging element may further include a gate electrode extending from a boundary face of the semiconductor substrate and reaching the transmission channel region in the dummy pixel region.

The optical black pixel region may be provided near an effective pixel region.

According to another embodiment of the present disclosure, there is provided an image pickup apparatus, including an imaging element having a transmission channel region provided in an optical black pixel region shielded from light from an outside of a semiconductor substrate by a light shielding film, for transmitting a charge existing inside the semiconductor substrate of the optical black pixel region to an outside of the optical black pixel region.

According to further another embodiment of the present disclosure, there is provided a manufacturing apparatus, including a transmission channel region formation part forming a transmission channel region provided in an optical black pixel region shielded from light from an outside of a semiconductor substrate by a light shielding film in the semiconductor substrate, for transmitting a charge existing inside the semiconductor substrate of the optical black pixel region to an outside of the optical black pixel region.

The transmission channel region formation part may form the transmission channel region in the semiconductor substrate by applying a resist to a boundary face of the semiconductor substrate on a surface side, forming a resist opening region at a predetermined position, and implanting an N-type impurity.

The transmission channel region formation part may implant the N-type impurity at a depth that the formed transmission channel region does not touch a photoelectric conversion element in the optical black pixel region.

The transmission channel region formation part may implant the N-type impurity having a concentration sufficient to invert a P-type impurity in a pixel separation region of the semiconductor substrate to an N-type impurity.

The transmission channel region formation part may form the transmission channel region in the semiconductor substrate by implanting the N-type impurity from a rear face side of the semiconductor substrate after forming an insulator film on the rear face side of the semiconductor substrate.

According to further another embodiment of the present disclosure, there is provided a manufacturing method of a manufacturing apparatus, including forming, by a transmission channel region formation part, a transmission channel region provided in an optical black pixel region shielded from light from an outside of a semiconductor substrate by a light shielding film in the semiconductor substrate, for transmitting a charge existing inside the semiconductor substrate of the optical black pixel region to an outside of the optical black pixel region.

According to further another embodiment of the present disclosure, there is provided a transmission channel region provided in an optical black pixel region shielded from light beams from the outside of a semiconductor substrate by a light shielding film, for transmitting a charge existing inside the semiconductor substrate of the optical black pixel region to the outside of the optical black pixel region.

According to further another embodiment of the present disclosure, there is provided an imaging element which includes a transmission channel region provided in an optical black pixel region shielded from light beams from the outside of a semiconductor substrate by a light shielding film, for transmitting a charge existing inside the semiconductor substrate of the optical black pixel region to the outside of the optical black pixel region.

According to further another embodiment of the present disclosure, there is formed a transmission channel region provided in an optical black pixel region shielded from light beams from the outside of a semiconductor substrate by a light shielding film, for transmitting a charge existing inside the semiconductor substrate of the optical black pixel region to the outside of the optical black pixel region.

According to the embodiments of the present disclosure described above, a black level reference can be detected. Particularly, the black level reference value can be more accurately detected.

DETAILED DESCRIPTION OF THE EMBODIMENT(S)

Figure 1:
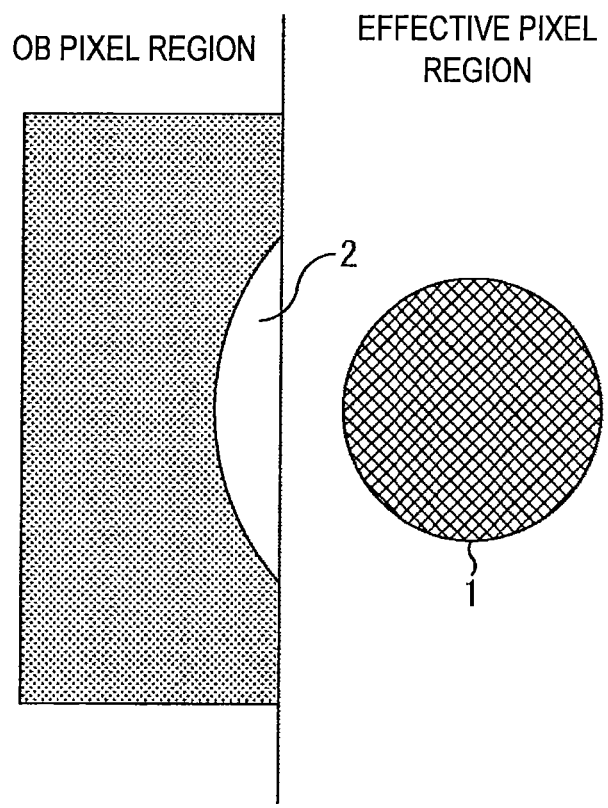
FIG. 1 is a diagram explanatory of an appearance of diffraction of light beams in an OB pixel region.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The preferred embodiments (hereinafter referred to as embodiments) according to the present technology will be described below in the following order.

1. First Embodiment (Imaging Element)
2. Second Embodiment (Manufacturing Apparatus Application example)
3. Third Embodiment (Imaging Element Application example)
4. Fourth Embodiment (Imaging Element Application example)
5. Fifth Embodiment (Image Pickup Apparatus)

1. First Embodiment

Diffraction of Light Beams

In the past, an image pickup apparatus or the like using an imaging element such as a CMOS (Complementary Metal Oxide Semiconductor) image sensor and a CCD (Charge Coupled Device) image sensor performed a clamp process for correcting an image signal obtained by the imaging element by using a black level of the image signal as a reference value.

For example, a pixel region (OB (Optical Black) pixel region) detecting the black level serving as the reference value is provided in a region other than an effective pixel region of the imaging element and each pixel value in the effective pixel region is corrected by use of the pixel value of the black level.

A structure of each pixel in the OB pixel region is similar to that of the pixel in the effective pixel region except being shielded from incident light beam from outside by a light shielding film. Accordingly, in theory, an influence other than the incident light beam can be eliminated from the pixel value of each pixel in the effective pixel region (a correct brightness value can be obtained) by using the pixel value of the OB pixel region as the black level reference value.

However, in practice, when extremely-intense light beams 1 such as sunlight beams are irradiated on the effective pixel region near the OB pixel region as illustrated in FIG. 1, for example, the incident light beams penetrate the OB pixel region inside the imaging element (diffraction of light beams occurs) sometimes.

In the example illustrated in FIG. 1, a pixel value deviates in a portion (region 2) of the OB pixel region caused by the intense light beams 1 irradiated on the effective pixel region near the OB pixel region. That is, the pixel value in the region 2 indicated by a white color is the same value, in theory, as the pixel value in another region indicated by a black color of the OB pixel region, but in the example illustrated in FIG. 1, the pixel value becomes larger than the pixel value of the other region indicated by a black color of the OB pixel region.

Especially, in the case of the back side illumination image sensor where a wiring layer is formed on the side opposite to the side on which light beams of a photodiode are incident, the above-described diffraction of light beams is likely to occur.

Figure 2:
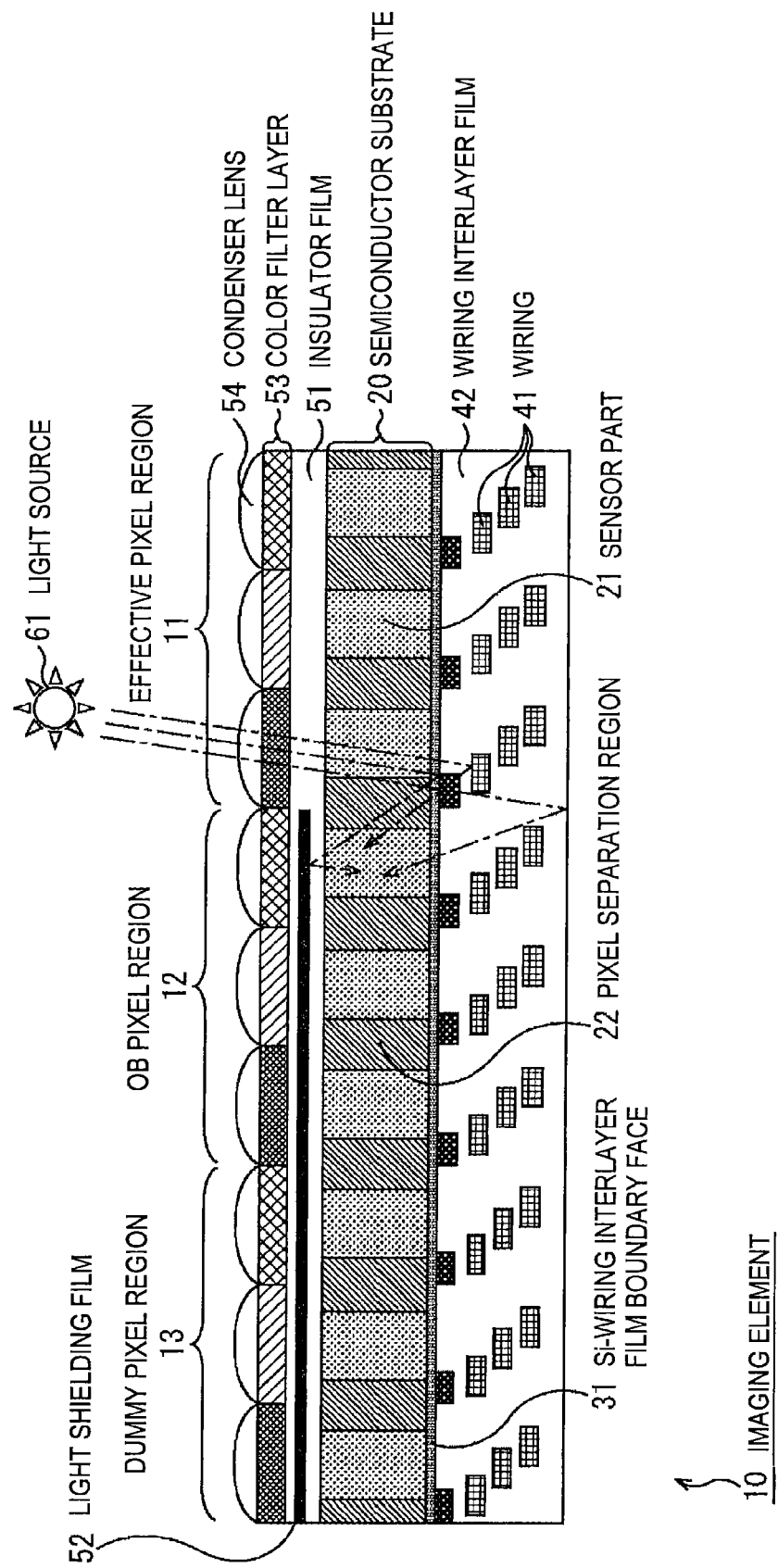
FIG. 2 is a diagram explanatory of an appearance of the diffraction of light beams in the OB pixel region.

FIG. 2 is a cross-sectional view of a CMOS image sensor. An imaging element 10 illustrated in FIG. 2 is a back side illumination CMOS image sensor. As illustrated in FIG. 2, sensor parts 21 in each of which a photoelectric conversion element such as a photodiode is formed and pixel separation regions 22 each disposed between the sensor parts 21 are formed on a semiconductor substrate 20.

On the rear face side (the upper side in the figure) of the semiconductor substrate 20, an insulator film 51, a color filter layer 53 and a condenser lens 54 are laminated. And on an OB pixel region 12 and a dummy pixel region 13, a light shielding film 52 shielding light beams incident on pixels in the regions is laminated.

In addition, on the surface side (the under side in the figure) of the semiconductor substrate 20, a silicon (Si)-wiring interlayer film boundary face 31 and a wiring layer are formed. On the wiring layer, wirings 41 and a wiring interlayer film 42 are formed.

In FIG. 2, respective partial pixel structures of an effective pixel region 11, the OB pixel region 12 and the dummy pixel region 13 are schematically illustrated.

A part of light beams from an intense light source 61 incident on pixels in the effective pixel region 11 near the OB pixel region 12 is reflected among the wiring layer, the boundary face and the like in the imaging element 10, and sometimes penetrates the rear side of the light shielding film 52 of the OB pixel region 12.

As described above, when the light beams penetrating the rear side of the light shielding film 52 of the OB pixel region 12 is photoelectrically converted by a photodiode of the pixel in the OB pixel region 12, the pixel value of the pixel deviates. That is, the diffraction of light beams occurs.

As described above, the back side illumination CMOS image sensor has a feature that the diffraction of light beams is prone to occur because of its structure.

As described above, when the pixel value of the OB pixel region deviates, the black level reference value in the clamp process deviates, so that it was difficult to accurately correct the pixel value in the effective pixel region. That is, robustness against the intense incident light beams was low in the past.

[Imaging Element]

In the present disclosure, the technology for improving robustness against the intense incident light beams and enabling the clamp process to be more appropriately performed will be described.

Figure 3:
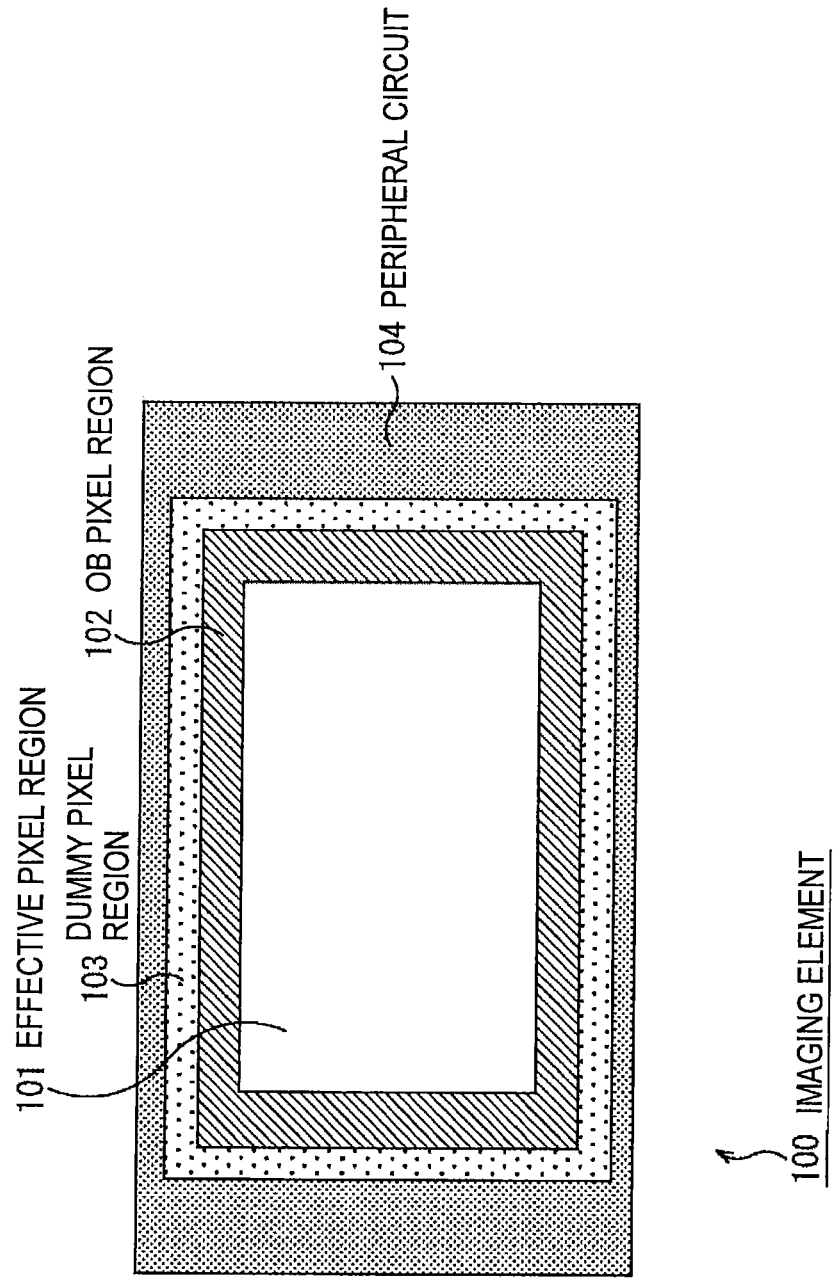
FIG. 3 is a diagram illustrating a major configuration example of an imaging element to which the present technology is applied.

FIG. 3 is a major configuration example of an image pickup apparatus to which the present technology is applied. An imaging element 100 illustrated in FIG. 3 is a back side illumination CMOS image sensor. As illustrated in FIG. 3, an effective pixel region 101 is formed at the center of a light irradiated area of the imaging element 100 and an OB pixel region 102 is formed so as to surround the effective pixel region 101. Further, a dummy pixel region 103 is formed so as to surround the OB pixel region 102 and a peripheral circuit 104 in which peripheral circuits are formed is formed on the outer side of the dummy pixel region 103.

Figure 4:
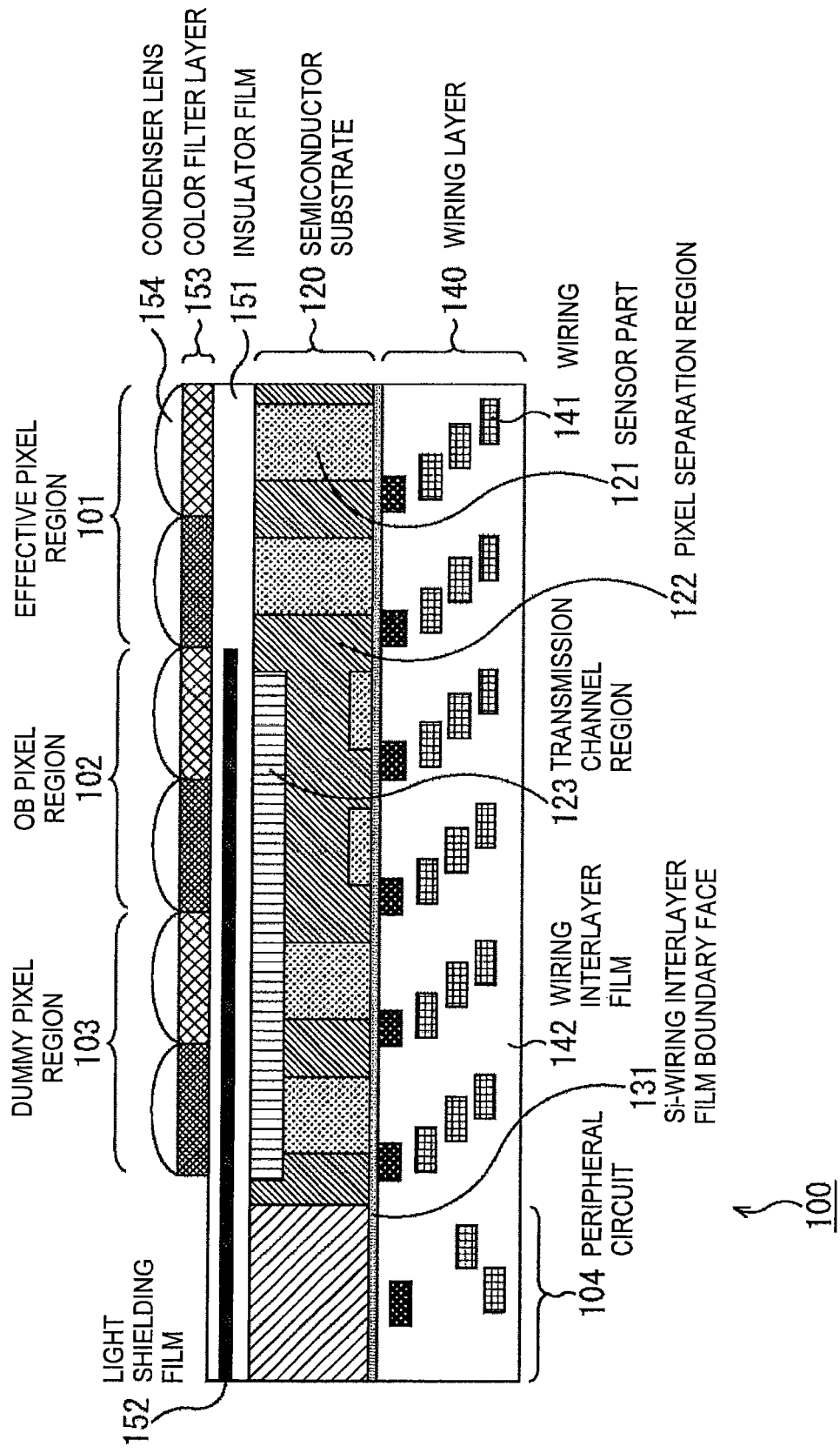
FIG. 4 is a diagram illustrating a major configuration example of the imaging element to which the present technology is applied.

FIG. 4 is a cross-sectional view explanatory of a configuration of each region of the imaging element 100. The upper side of the figure corresponds to the light irradiate area (rear face side). That is, light beams from a subject enter the imaging element 100 from the upper side to the under side of the figure.

The imaging element 100 has a multilayer structure along a traveling direction of the incident light beams. That is, the incident light beams on the imaging element 100 travel so as to pass through each layer.

Note that, FIG. 4 illustrates only a configuration of a portion (near a boundary of each region) of pixels in the effective pixel region 101 through the dummy pixel region 103 and a partial configuration of the peripheral circuit 104.

In the effective pixel region 101 through the dummy pixel region 103, a sensor part 121 including a photoelectric conversion element such as a photodiode is formed with respect to each pixel on the semiconductor substrate 120 of the imaging element 100. Between the sensor parts 121 is a pixel separation region 122.

Structures of pixels of the effective pixel region 101 through the dummy pixel region 103 are basically similar to each other. Note that, the dummy pixel region 103 is a region provided in order to stabilize properties of the pixels in the effective pixel region 101 and the OB pixel region 102, so that a pixel output from the dummy pixel region is not used basically (not used for a dark output (black level) reference). Here, the dummy pixel region 103 takes a role of inhibiting a shape variation at the time of forming the color filter layer 153 and the condenser lens 154 due to a difference in patterns from the OB pixel region 102 to the peripheral circuit 104.

In addition, each pixel of the OB pixel region 102 and the dummy pixel region 103 is shielded from light beams by the light shielding film 152 formed in the insulator film 151 such that the light beams do not enter the pixel. Accordingly, a pixel output of the OB pixel region becomes, ideally, the dark output (black level) reference. In practice, because the pixel value sometimes deviates due to diffraction of light beams and the like from the effective pixel region 101, the imaging element 100 is constituted so as to inhibit this influence.

For example, the sensor part 121 of each pixel in the OB pixel region 102 is not formed to a deep part of the semiconductor substrate 120 but formed in a shallow region on the surface side in order to reduce sensitivity.

Further, in a deep part (rear face side) of the semiconductor substrate 120 at a depth of not intersecting with the sensor part 121 of each pixel in the effective pixel region 101, a transmission channel region 123 serving as a path of an electron from the OB pixel region 102 to the dummy pixel region 103 is formed.

On the surface side of the semiconductor substrate 120, a silicon (Si)-wiring interlayer film boundary face 131 and a wiring layer 140 are laminated. In the wiring layer 140, multilayered wirings 141 and a wiring interlayer film 142 made of an insulating material between wirings 141 are formed.

On the rear face side of the semiconductor substrate 120, an insulator film 151, a color filter layer 153 and a condenser lens 154 are laminated. As describe above, a light shielding film 152 shielding light beams is formed in the insulator film 151 of the OB pixel region 102 and the dummy pixel region 103. Because of this, it is realized that black level can be set based on the image and negative effects on the device due to the incident light beams on the peripheral circuits can be eliminated.

In the peripheral circuit 104, a read out gate, a vertical charge transfer part transferring a read-out signal charge in a vertical direction and a horizontal charge transfer part are formed.

Figure 5:
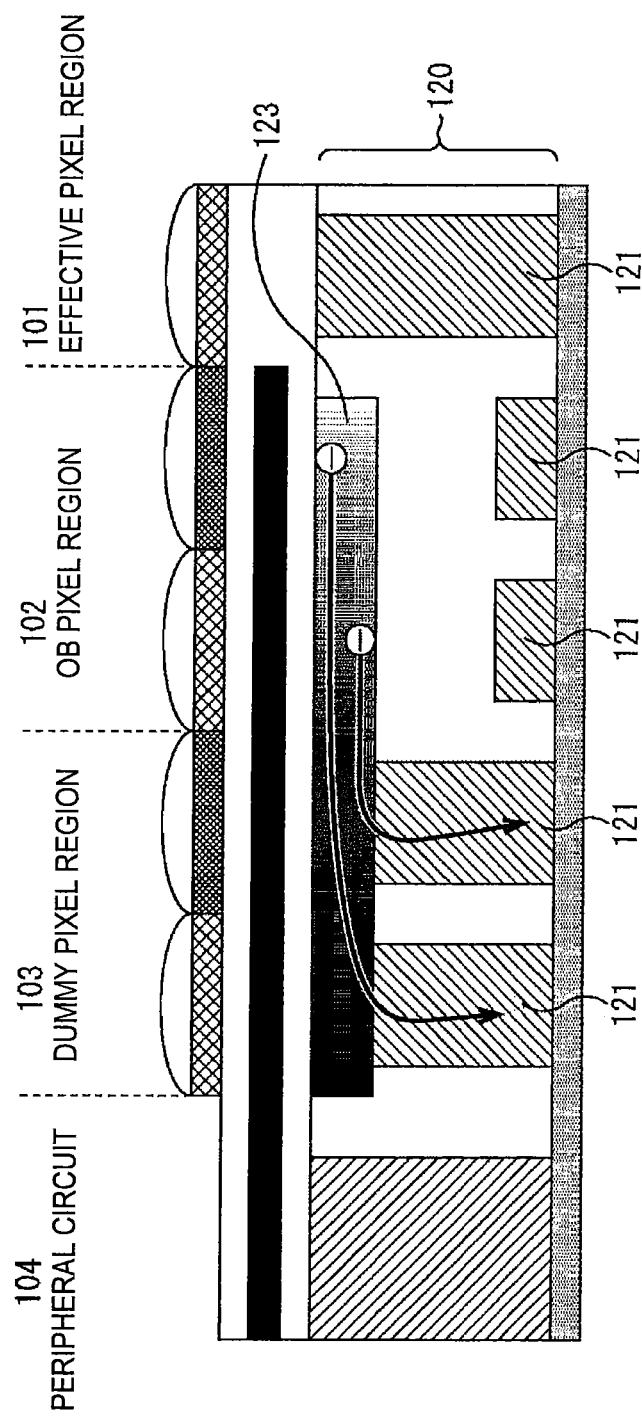
FIG. 5 is a diagram explanatory of a transmission channel region.

FIG. 5 is a diagram explanatory of the transmission channel region 123. As illustrated in FIG. 5 by a gradation, the transmission channel region 123 has a potential gradient from the OB pixel region 102 toward the dummy pixel region 103 such that the potential lowers as the gradient draws closer to the dummy pixel region 103 side. That is, the potential gradient is formed in the transmission channel region 123 such that the potential lowers along a horizontal direction from the inside to the outside of the OB pixel region 102.

As described above, because the sensor part 121 is shallowly formed in the OB pixel region 102, the transmission channel region 123 is formed so as not to touch the sensor part 121. On the other hand, as illustrated in FIG. 4 and FIG. 5, the transmission channel region 123 is formed so as to touch the sensor part 121 in the dummy pixel region 103.

As illustrated in FIG. 5, a charge entering from the effective pixel region 101 to the OB pixel region 102 enters the transmission channel region 123 having potential set lower than that of a surrounding area and the charge is further induced to the dummy pixel region 103 side due to the potential gradient of the transmission channel region 123. The charge induced to the dummy pixel region 103 enters the sensor part 121 of the dummy pixel region 103 and is accumulated.

As described above, the imaging element 100 can decrease the possibility of accumulation in the sensor part 121 of the OB pixel region 102 because the charge entering the OB pixel region 102 through the transmission channel region 123 is induced to the outside of the OB pixel region 102. That is, the imaging element 100 can inhibit deviation in the pixel value of the OB pixel region 102 caused by diffraction of light beams and the more accurate black level reference value can be detected.

Note that, in the above description, though two pixels are illustrated in each of the effective pixel region 101 through the dummy pixel region 103, the number (width) of pixels in each region is arbitrary.

[Manufacturing]

An example of a manufacturing method of the imaging element 100 will be described below.

Figure 6:
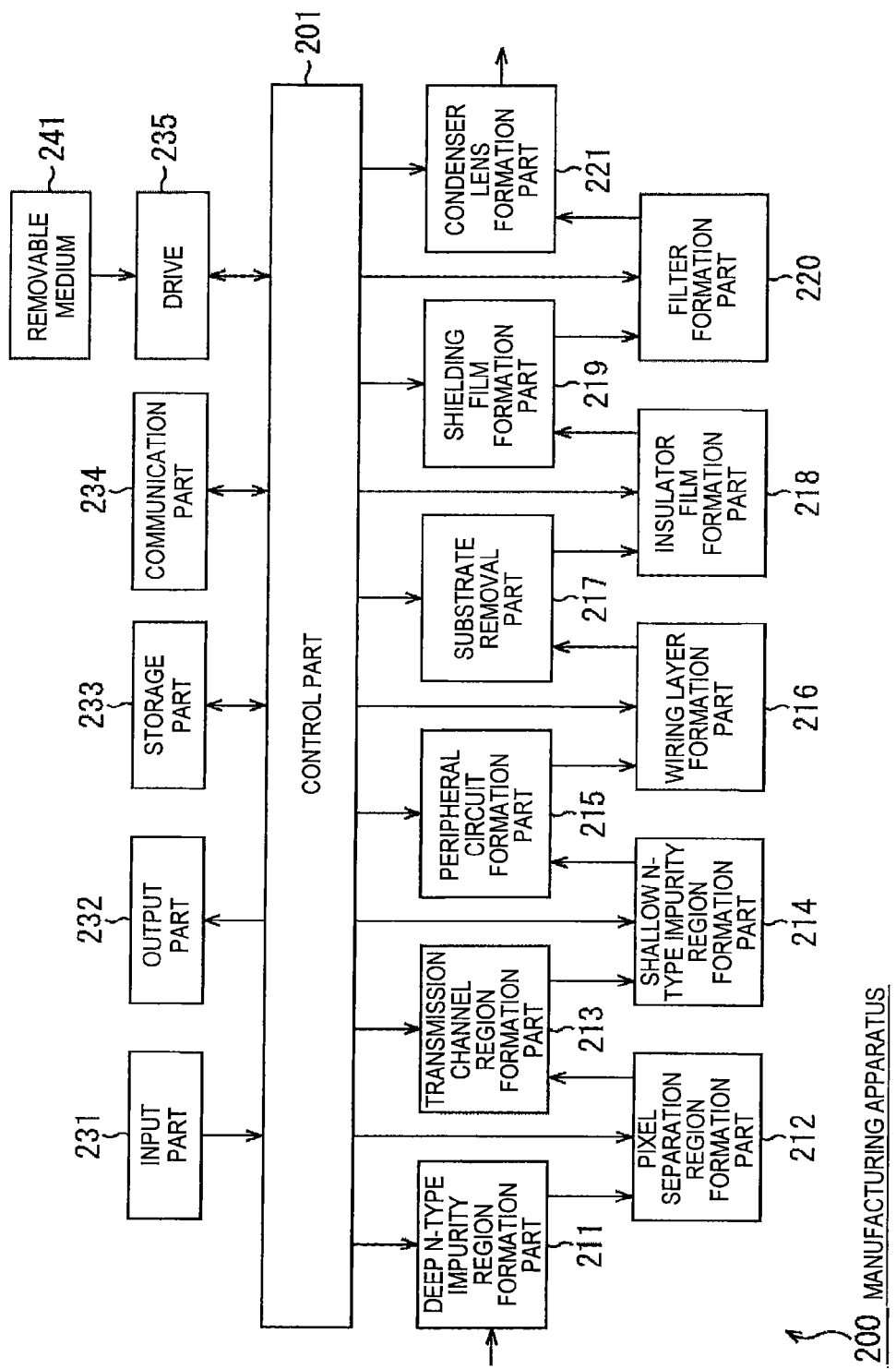
FIG. 6 is a block diagram illustrating a major configuration example of a manufacturing apparatus to which the present technology is applied.

FIG. 6 is a block diagram illustrating a major configuration example of a manufacturing apparatus manufacturing the imaging element 100. The manufacturing apparatus 200 includes a control part 201, a deep N-type impurity region formation part 211, a pixel separation region formation part 212, a transmission channel region formation part 213, a shallow N-type impurity region formation part 214, a peripheral circuit formation part 215, a wiring layer formation part 216, a substrate removal part 217, an insulator film formation part 218, a light shielding film formation part 219, a filter formation part 220 and a condenser lens formation part 221 as shown in FIG. 6. Further, the manufacturing apparatus 200 includes an input part 231, a output part 232, a storage part 233, a communication part 234 and a drive 235.

The control part 201 includes, for example, CPU (Central Processing Unit), ROM (Read Only Memory), RAM (Random Access Memory) and the like, and controls each of other parts and performs processes relevant to manufacturing of the imaging element 100. For example, CPU of the control part 201 executes various kinds of processes based on programs stored in ROM. In addition, CPU executes various kinds of processes based on programs loaded on RAM from the storage part 233. Data necessary for CPU when executing the various kinds of processes is stored in RAM as appropriate.

The deep N-type impurity region formation part 211 through the condenser lens formation part 221 perform processes of each process manufacturing the imaging element 100 under control of the control part 201.

The input part 231 includes a keyboard, a mouse, a touch panel, an external input terminal and the like, and accepts inputs of a user instruction and information from outside and supplies an input user instruction and information from outside to the control part 201. The output part 232 includes a display such as a CRT (Cathode Ray Tube) display and an LCD (Liquid Crystal Display), a speaker, an external output terminal and the like, and outputs various kinds of information supplied from the control part 201 as an image, a sound, an analog signal or digital data.

The storage part 233 includes SSD (Solid State Drive) such as a flash memory, a hard disk and the like, and stores information supplied from the control part 201 or reads out stored information and supplies the read-out information in response to a request from the control part 201.

The communication part 234 includes, for example, interfaces of a wired LAN (Local Area Network) or a wireless LAN, a modem and the like, and performs a communication process with an external device over a network including the Internet. For example, the communication part 234 transmits information supplied from the control part 201 to a communication destination or supplies information received from the communication destination to the control part 201.

The drive 235 is connected to the control part 201 as appropriate. And a removable medium 241 such as a magnetic disk, an optical disk, a photo magnetic disk and a semiconductor memory is loaded on the drive 235 as appropriate. And a computer program read out from the removable medium 241 via the drive 235 is installed in the storage part 233 as appropriate.

A flow example of the manufacturing process will be described with reference to a flowchart of FIG. 7. In addition, the description will refer to FIG. 8 through FIG. 13 as appropriate. FIG. 8 through FIG. 13 are diagrams explanatory of appearances of each process flow of the manufacturing process.

Figure 8:
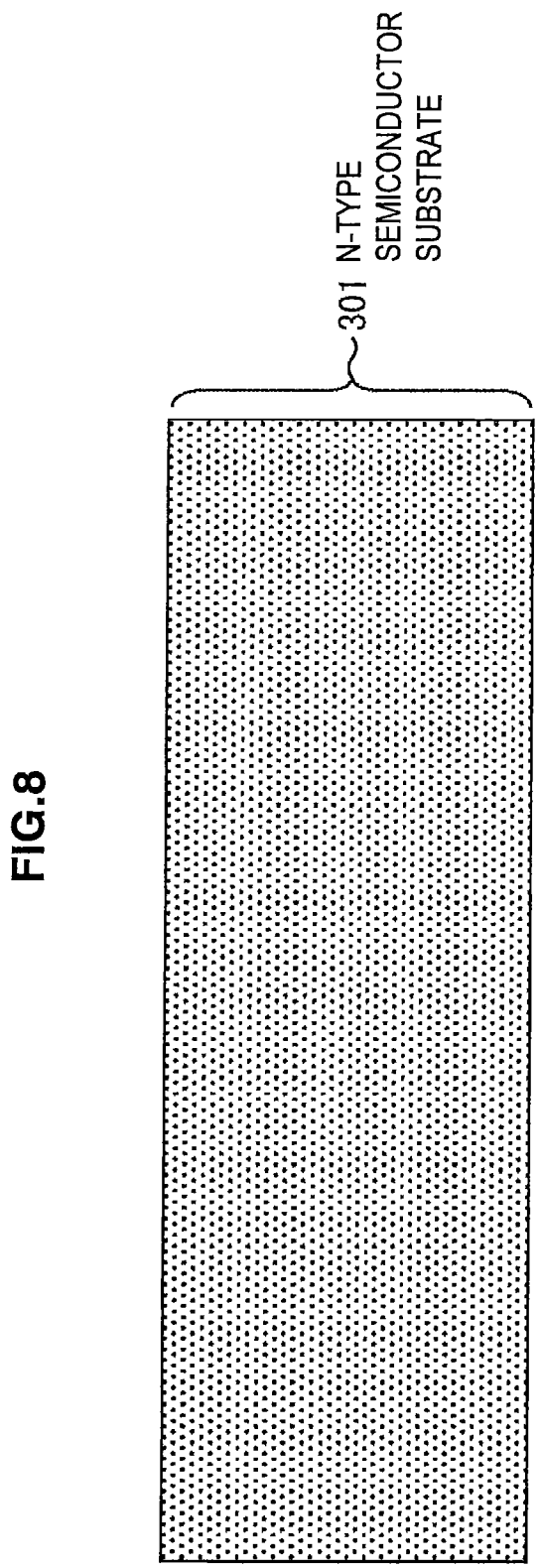
FIG. 8 is a diagram explanatory of the manufacturing process.

When the manufacturing process starts, in step S101, the deep N-type impurity region formation part 211 forms a deep N-type impurity region in the N-type semiconductor substrate 301 as illustrated in FIG. 8 under control of the control part 201.

Figure 9:
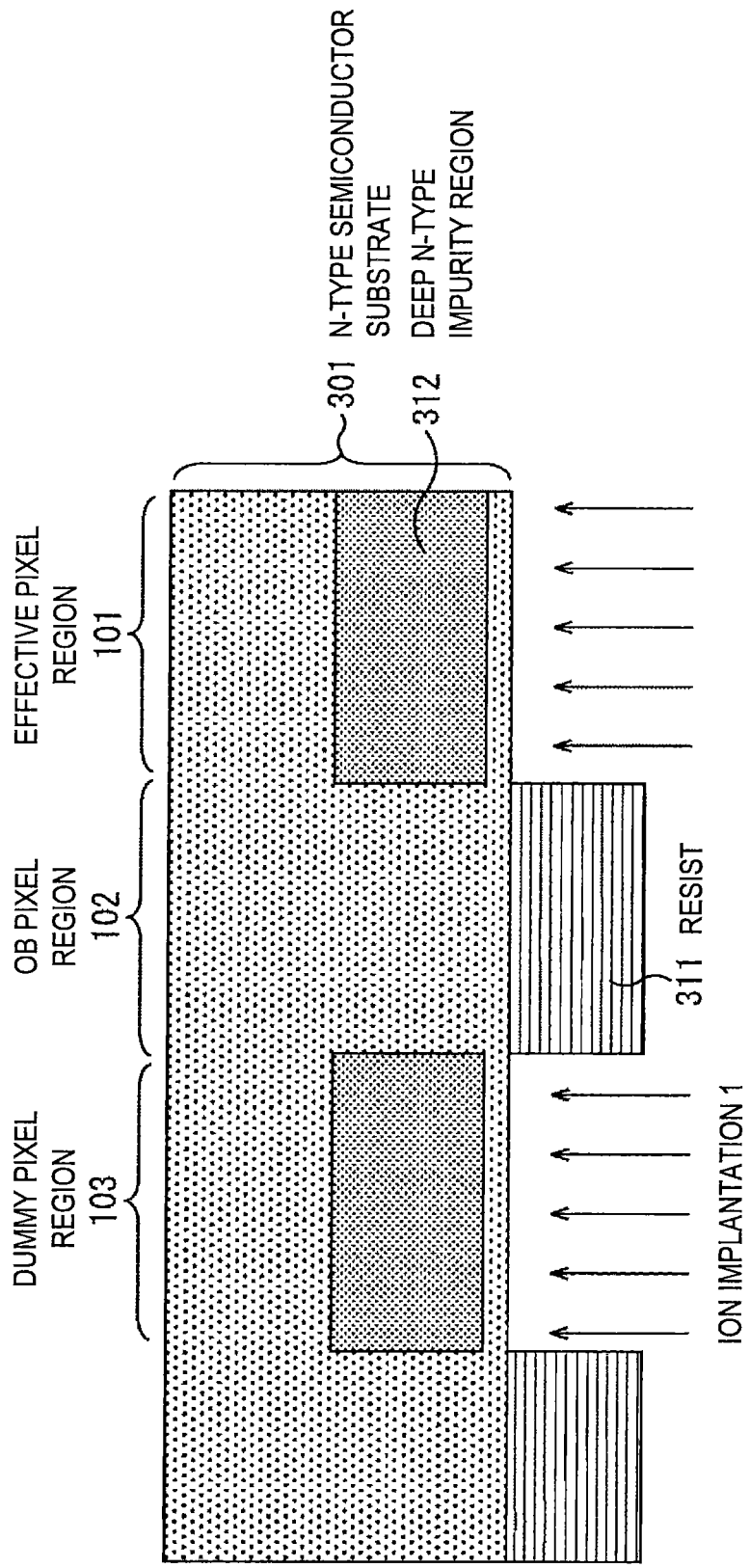
FIG. 9 is a diagram explanatory of the manufacturing process.

More specifically, the deep N-type impurity region formation part 211 applies a resist 311 to the N-type semiconductor substrate 301 on the surface side as illustrated in FIG. 9 and forms a resist opening region by using a mask and a lithography technology. Subsequently, the deep N-type impurity region formation part 211 performs ion implantation 1 to form a deep N-type impurity region 312. At this point the ion implantation 1 is not performed on the OB pixel region 102. A film thickness of the resist 311 is determined depending on a depth of the deep N-type impurity region 312, that is, energy of the ion implantation 1. When the ion implantation 1 finishes, the resist 311 is peeled off.

In step S102, the pixel separation region formation part 212 forms the pixel separation region 122 in an N-type semiconductor substrate 301 under control of the control part 201.

Figure 10:
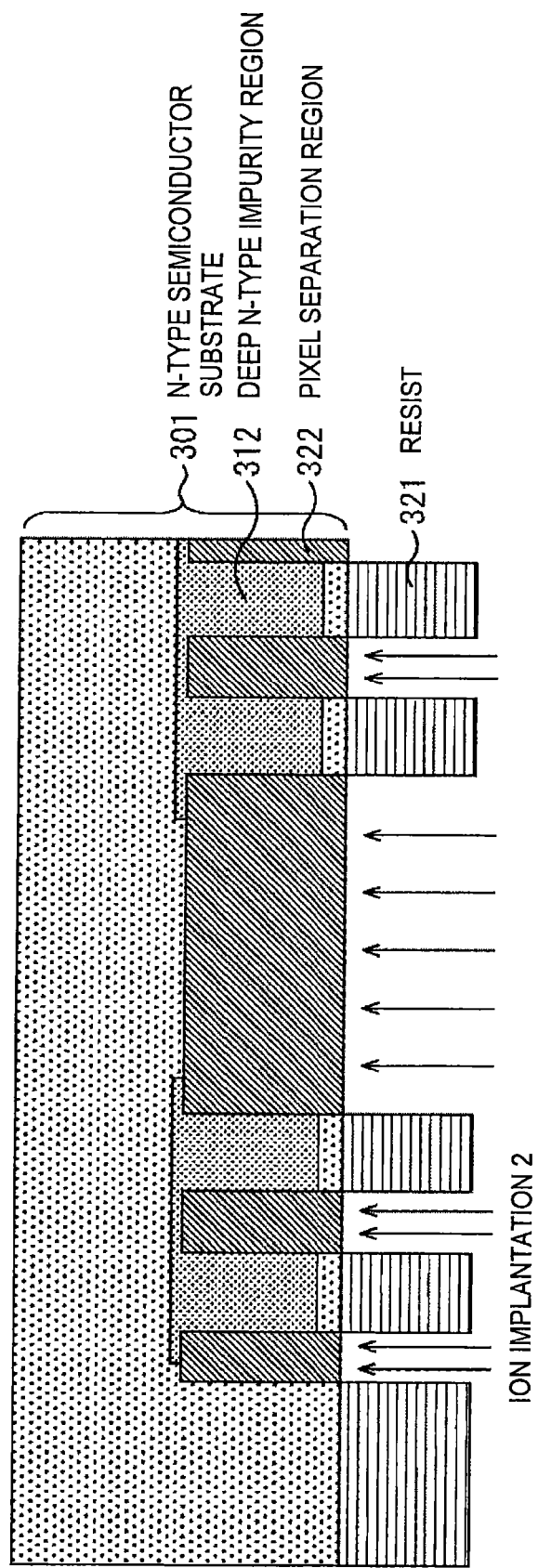
FIG. 10 is a diagram explanatory of the manufacturing process.

More specifically, the pixel separation region formation part 212 applies a resist 321 to the N-type semiconductor substrate 301 on the surface side as illustrated in FIG. 10 and forms a resist opening region by using a mask and a lithography technology. Subsequently, the pixel separation region formation part 212 performs ion implantation 2 to form the pixel separation region 122. Here, it is desirable to narrow a width of the pixel separation region as much as possible in order to expand space for the sensor part 121 described later. In general, a limit value of a width of the resist opening is set based on a resist film thickness. As a result, it is desirable to cause the optimum resist film thickness and the opening width to be set based on the ion implantation energy. When the ion implantation 2 finishes, the resist 321 is peeled off.

In step S103, the transmission channel region formation part 213 forms the transmission channel region 123 in the OB pixel region 102 and the dummy pixel region 103 of the N-type semiconductor substrate 301 under control of the control part 201.

Figure 11:
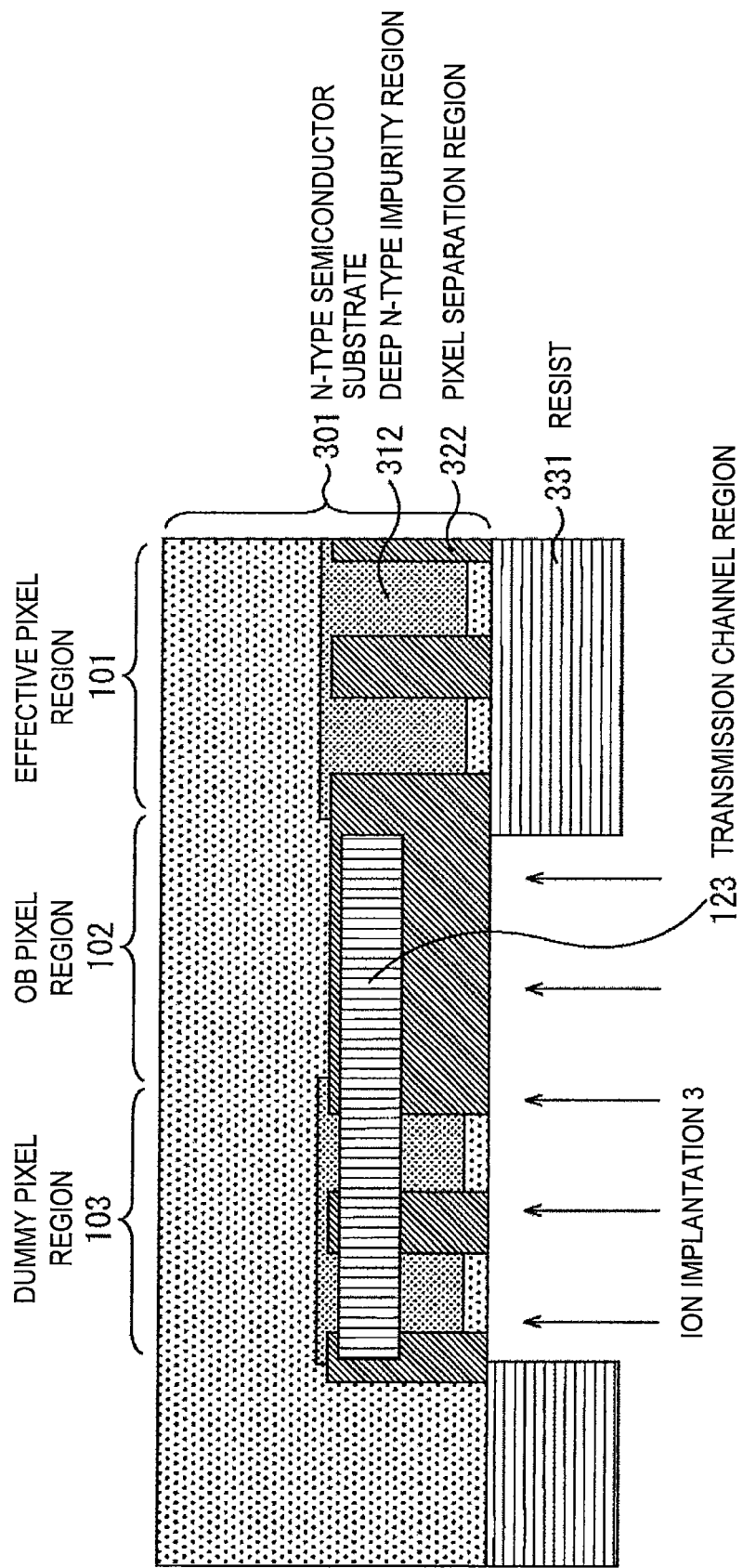
FIG. 11 is a diagram explanatory of the manufacturing process.

More specifically, the transmission channel region formation part 213 applies a resist 331 to the N-type semiconductor substrate 301 on the surface side as illustrated in FIG. 11 and forms a resist opening region by using a mask and a lithography technology. Subsequently, the transmission channel region formation part 213 performs ion implantation 3 to form the transmission channel region 123. The ion implantation 3 is performed by an N-type impurity. And an implantation depth is determined within a range where the transmission channel region 123 can be separated from the sensor part 121 of the OB pixel region 102 to be described below. Further, it is desirable for a concentration of the implanted impurity to be enough to invert a P-type impurity concentration of the pixel separation region 122 to N-type. When the ion implantation 3 finishes, the resist 313 is peeled off.

In step S104, the shallow N-type impurity region formation part 214 forms a shallow N-type impurity region (sensor part 121) on the N-type semiconductor substrate 301 under control of the control part 201.

Figure 12:
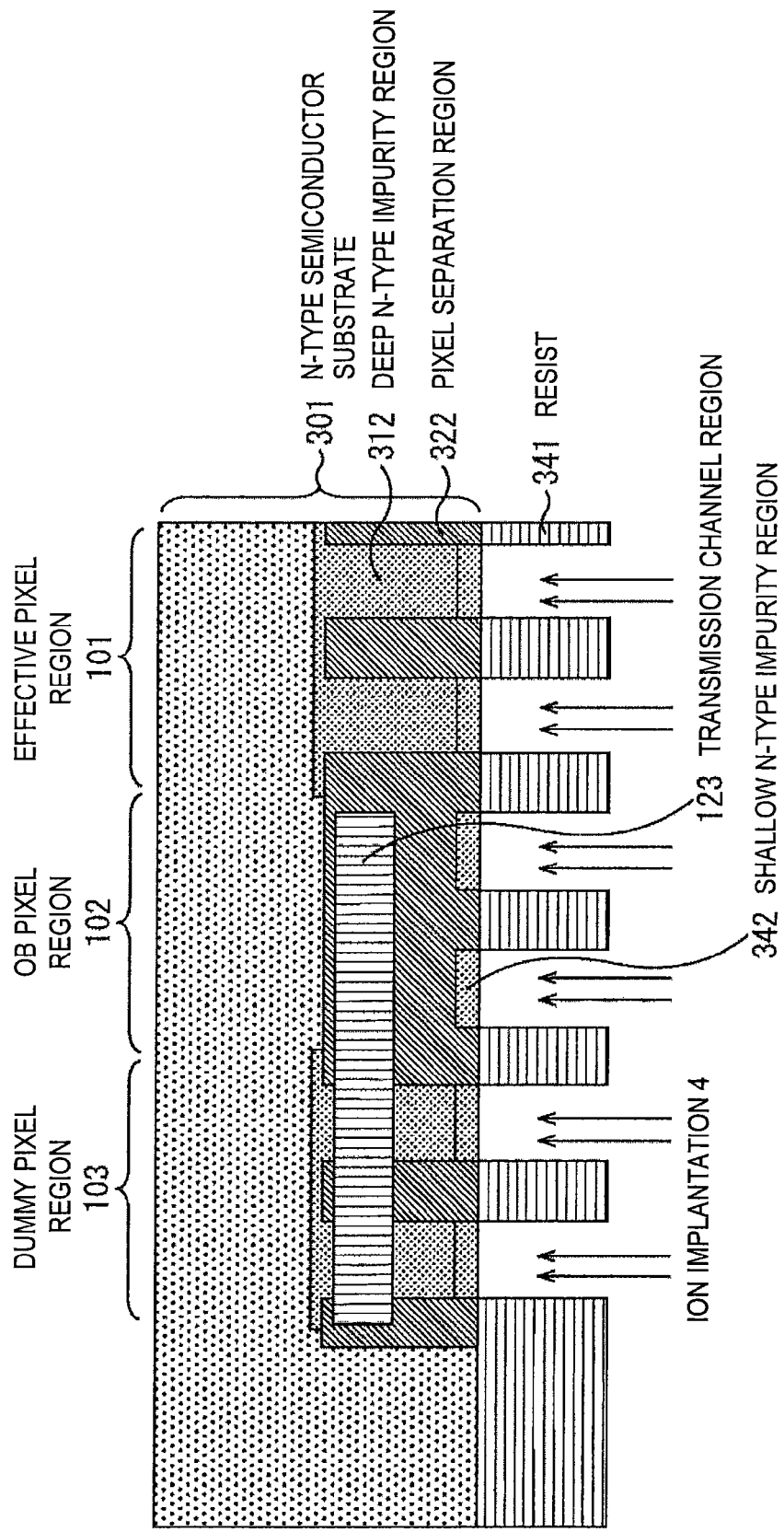
FIG. 12 is a diagram explanatory of the manufacturing process.

More specifically, the shallow N-type impurity region formation part 214 applies a resist 341 to the N-type semiconductor substrate 301 on the surface side as illustrated in FIG. 12 and forms a resist opening region by using a mask and a lithography technology. Subsequently, the shallow N-type impurity region formation part 214 performs ion implantation 4 to form a shallow N-type impurity region 342. At this point, all of the effective pixel region 101, the OB pixel region 102 and the dummy pixel region 103 are target regions of the implantation. The shallow N-type impurity region 342 serves as the sensor part 121 of the OB pixel region 102 and determines the reference of the dark signal output. When the ion implantation 4 finishes, the resist 341 is peeled off.

In step S105, the peripheral circuit formation part 215 forms the peripheral circuit 104 under control of the control part 201.

In step S106, the wiring layer formation part 216 forms the wiring layer 140 under control of the control part 201.

Figure 13:
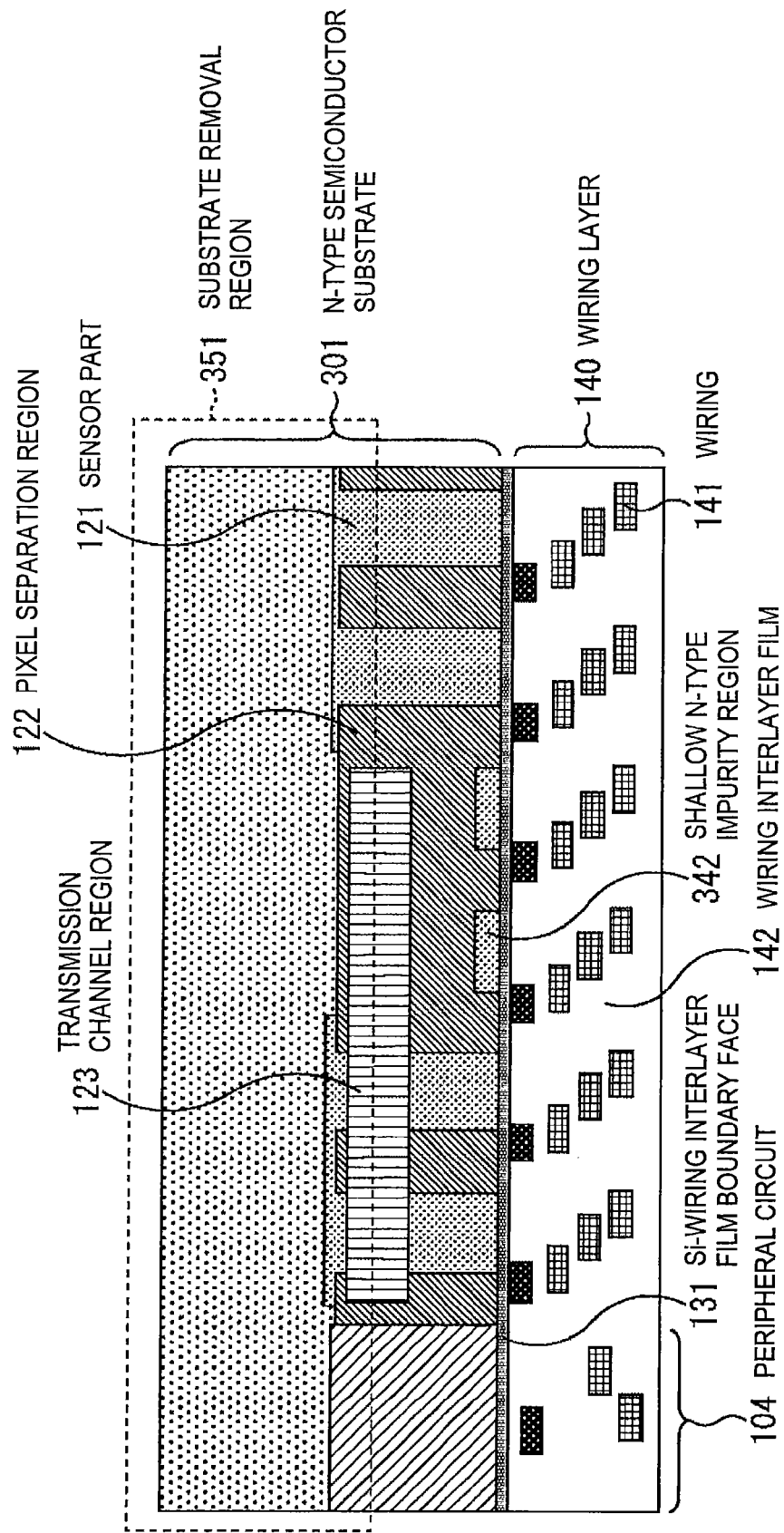
FIG. 13 is a diagram explanatory of the manufacturing process.

In step S107, the substrate removal part 217 removes unnecessary portion (portion surrounded by a dotted line) of the N-type semiconductor substrate 301 on the rear face side as illustrated in FIG. 13 by polishing based on CMP or the like under control of the control part 201.

In step S108, the insulator film formation part 218 forms the insulator film 151 on the semiconductor substrate 120 on the rear face side under control of the control part 201.

In step S109, the light shielding film formation part 219 forms the light shielding film 152 in the insulator film 151 under control of the control part 201.

In step S110, the filter formation part 220 forms the color filter layer 153 in a Bayer arrangement, for example, on the insulator film 151 on the rear face side under control of the control part 201.

In step S111, the condenser lens formation part 221 forms the condenser lens 154 with respect to each pixel on the color filter layer 153 on the rear face side under control of the control part 201.

As described above, the imaging element 100 having the configuration illustrated in FIG. 4 is manufactured. That is, the manufacturing apparatus 200 can easily manufacture the imaging element 100 without any special complex process.

In addition, according to the above description, though the sensor part 121 is formed of the deep N-type impurity region 312 and the shallow N-type impurity region 342, the sensor part 121 is practically formed through a plurality of impurity implantation processes such as formation of the potential gradient necessary for the charge transfer and covering of a surface with a P-type impurity layer for inhibiting a dark current.

And the above described process sequence can be performed in no particular order as long as it is consistent.

2. Second Embodiment

Manufacturing

Note that, the ion implantation for forming the transmission channel region 123 can be performed from the rear face side.

Figure 14:
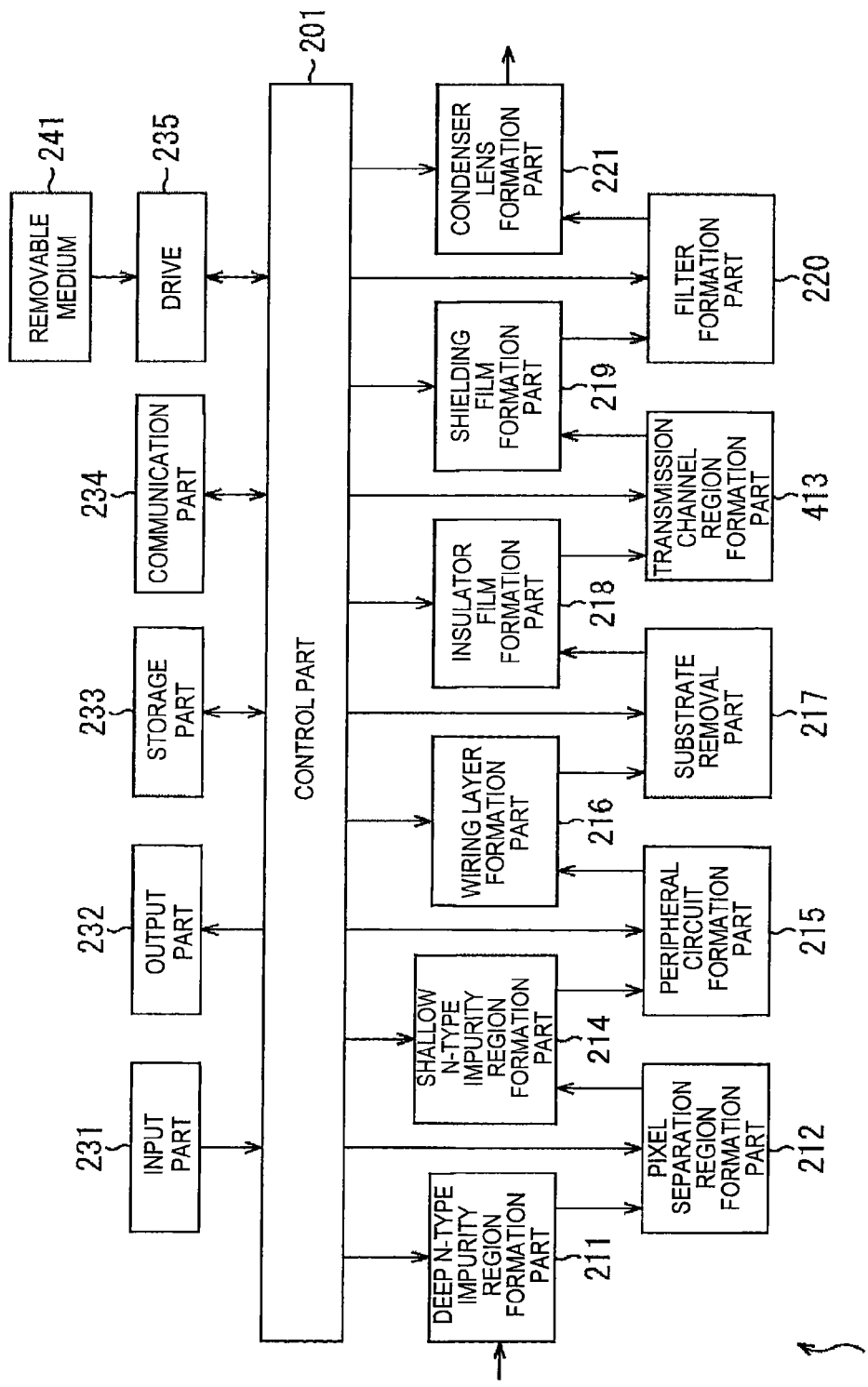
FIG. 14 is a block diagram illustrating another configuration example of a manufacturing apparatus to which the present technology is applied.

FIG. 14 is a block diagram illustrating a configuration example of the manufacturing apparatus manufacturing the imaging element 100 in this case. The manufacturing apparatus 400 illustrated in FIG. 14 is basically similar to the manufacturing apparatus 200 in FIG. 6 and has the similar configuration and performs similar processes.

Note that, the transmission channel region formation part 213 is omitted in the manufacturing apparatus 400 but a transmission channel region formation part 413 is included instead.

The transmission channel region formation part 413 performs processes forming the transmission channel region 123 like the transmission channel region formation part 213 after forming the insulator film 151.

Figure 15:
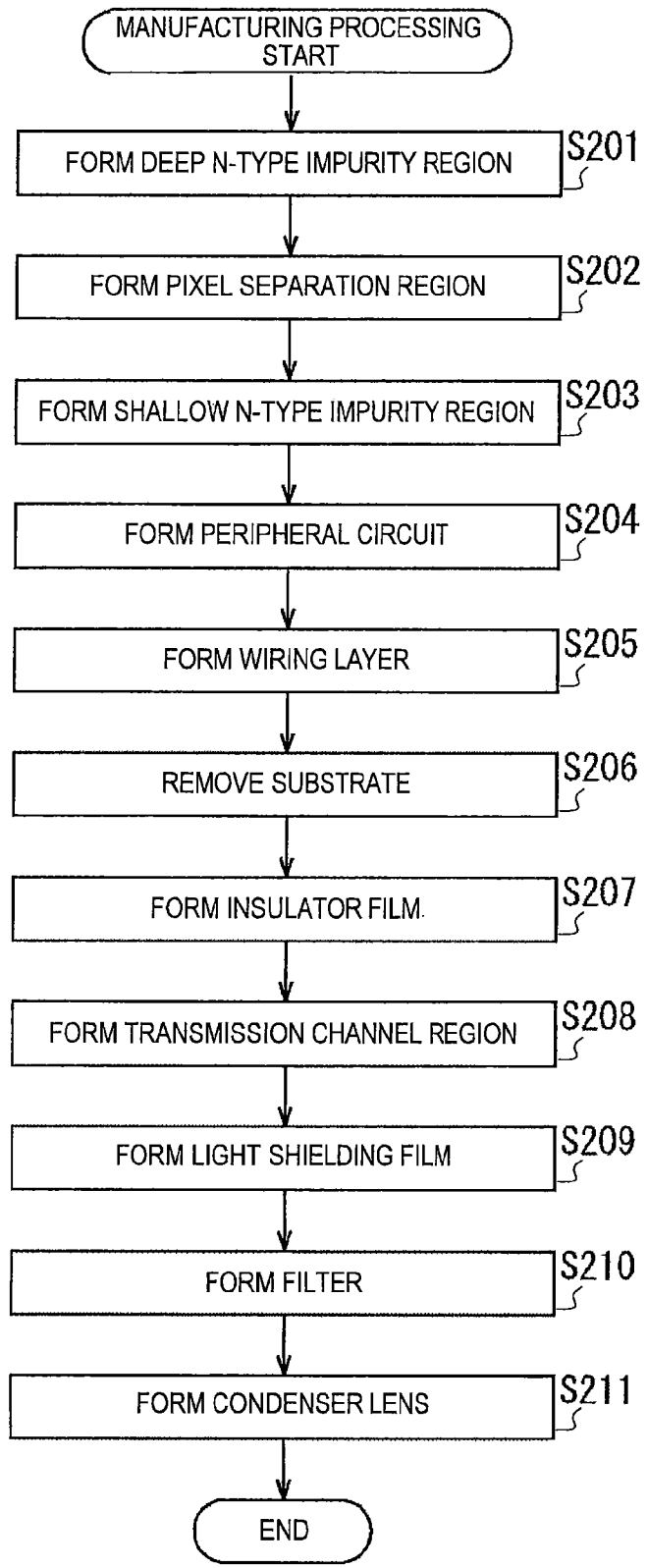
FIG. 15 is a flowchart explanatory of another flow example of a manufacturing process.

A flow example of the manufacturing process in this case will be described with reference to a flowchart of FIG. 15. The description will refer to FIG. 16 and FIG. 17 as appropriate.

Figure 7:
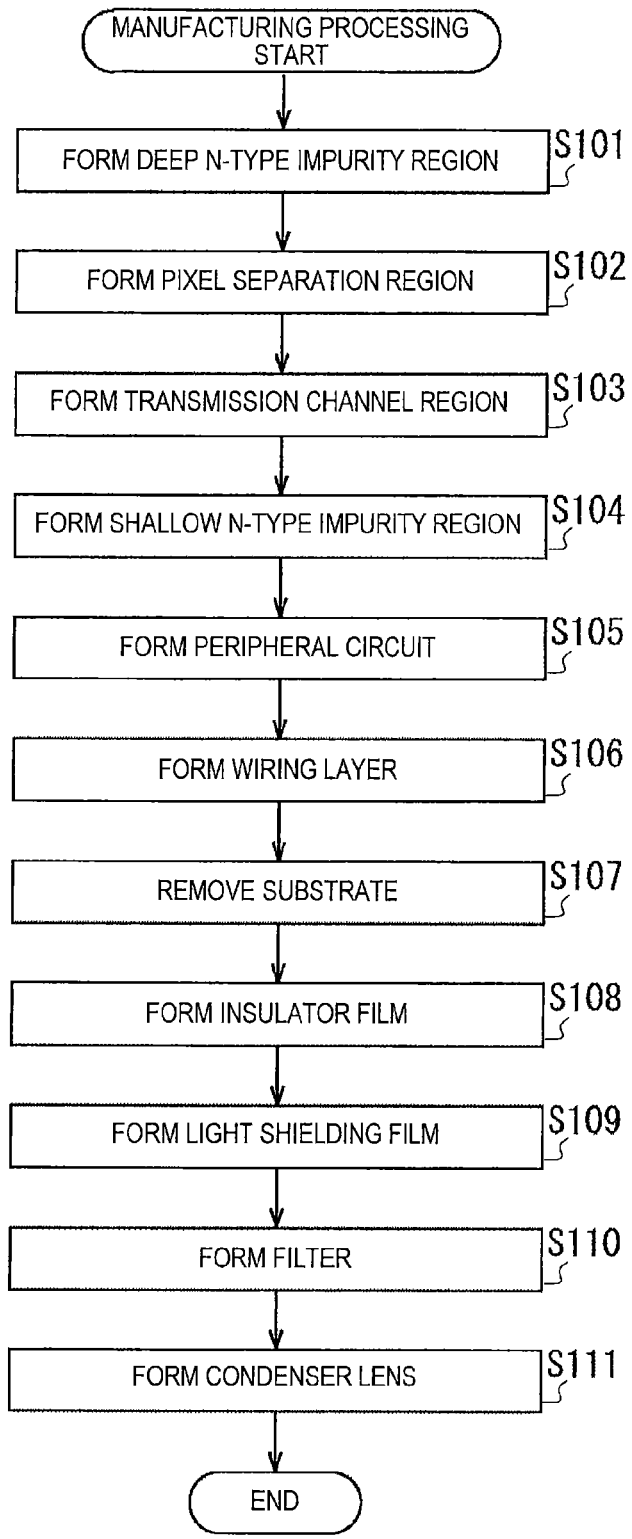
FIG. 7 is a flowchart explanatory of a flow example of a manufacturing process.

Each of the processes in step S201 and step S202 is performed similarly to each of the processes in step S101 and step S102 illustrated in FIG. 7. Subsequently, the process in step S103 is omitted and each of the processes in step S203 through step S207 is performed similarly to each of the processes in step S104 through step S108 illustrated in FIG. 7.

Figure 16:
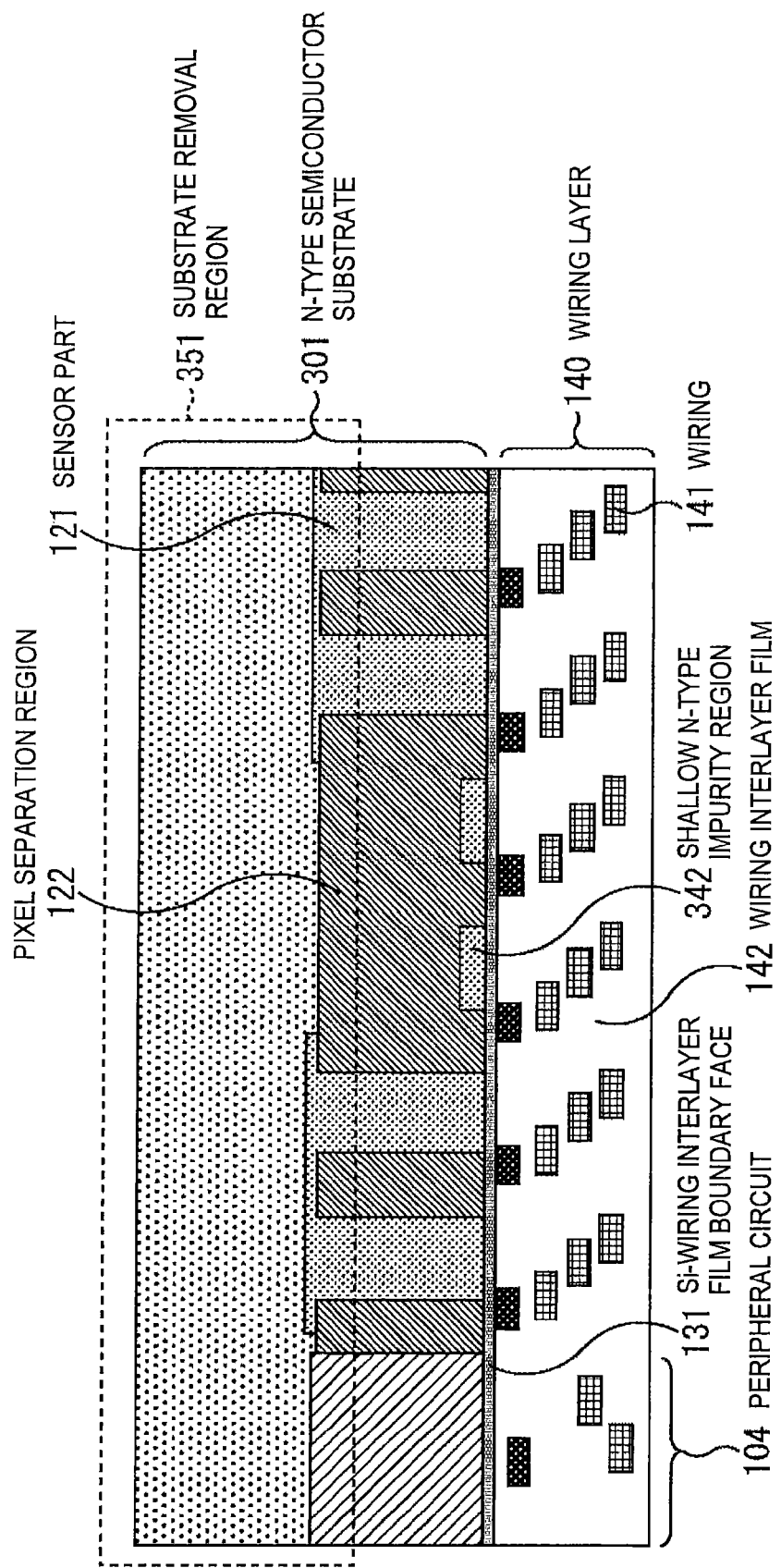
FIG. 16 is a diagram explanatory of the manufacturing process.

At this point, the transmission channel region 123 is not formed in the N-type semiconductor substrate 301 as illustrated in FIG. 16.

In step S208, the transmission channel region formation part 413 forms the transmission channel region 123 on the N-type semiconductor substrate 301 in the OB pixel region 102 and the dummy pixel region 103 under control of the control part 201.

Figure 17:
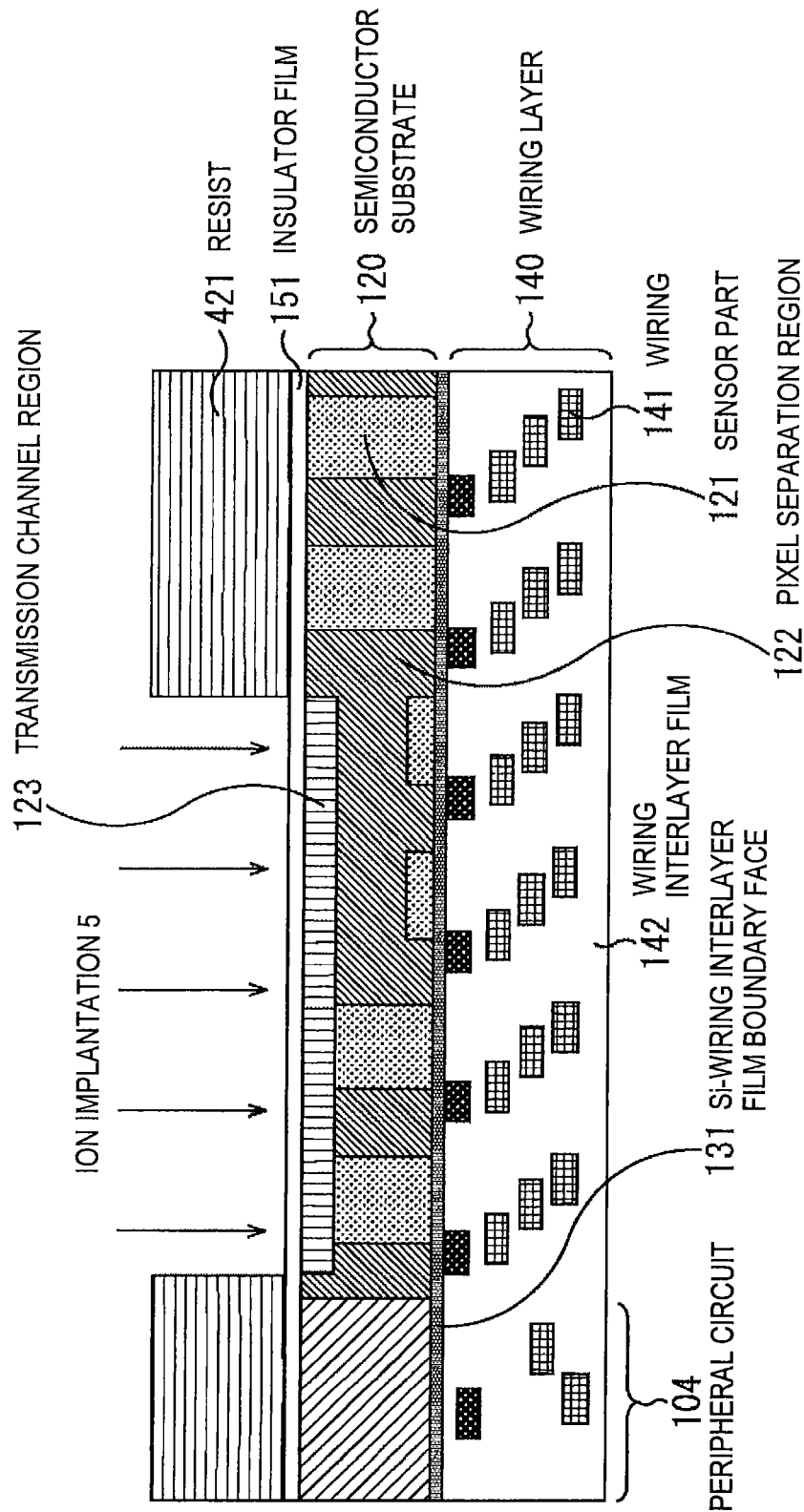
FIG. 17 is a diagram explanatory of the manufacturing process.

More specifically, the transmission channel region formation part 413 applies the resist 421 to the N-type semiconductor substrate 301 on the rear face side (rear face side of the insulator film 151) and forms a resist opening region by using a mask and a lithography technology as illustrated in FIG. 17. Subsequently, the transmission channel region formation part 413 performs ion implantation 5 from the rear face side to form the transmission channel region 123. At this point, because a thermal process for impurity activation is performed after forming the wirings, it is desirable to employ activation procedure in a limited region such as laser anneal.

Each of the processes in step S209 through step S211 is performed similarly to each of the processes in step S109 through step S111 illustrated in FIG. 7.

As described above, the manufacturing apparatus 400 can easily manufacture, without any special complex process, the imaging element 100 having the structure illustrated in FIG. 4 by performing each of the processes.

3. Third Embodiment

Imaging Element

The present disclosure has a feature of discharging an electron photoelectrically converted in the deep region of the OB pixel region 102 to the dummy pixel region 103 and transferring of the electron is an important factor. In order to increase efficiency of transferring the charge in the dummy pixel region 103, a gate electrode may be embedded in the dummy pixel region 103 of the semiconductor substrate 120, for example.

Figure 18:
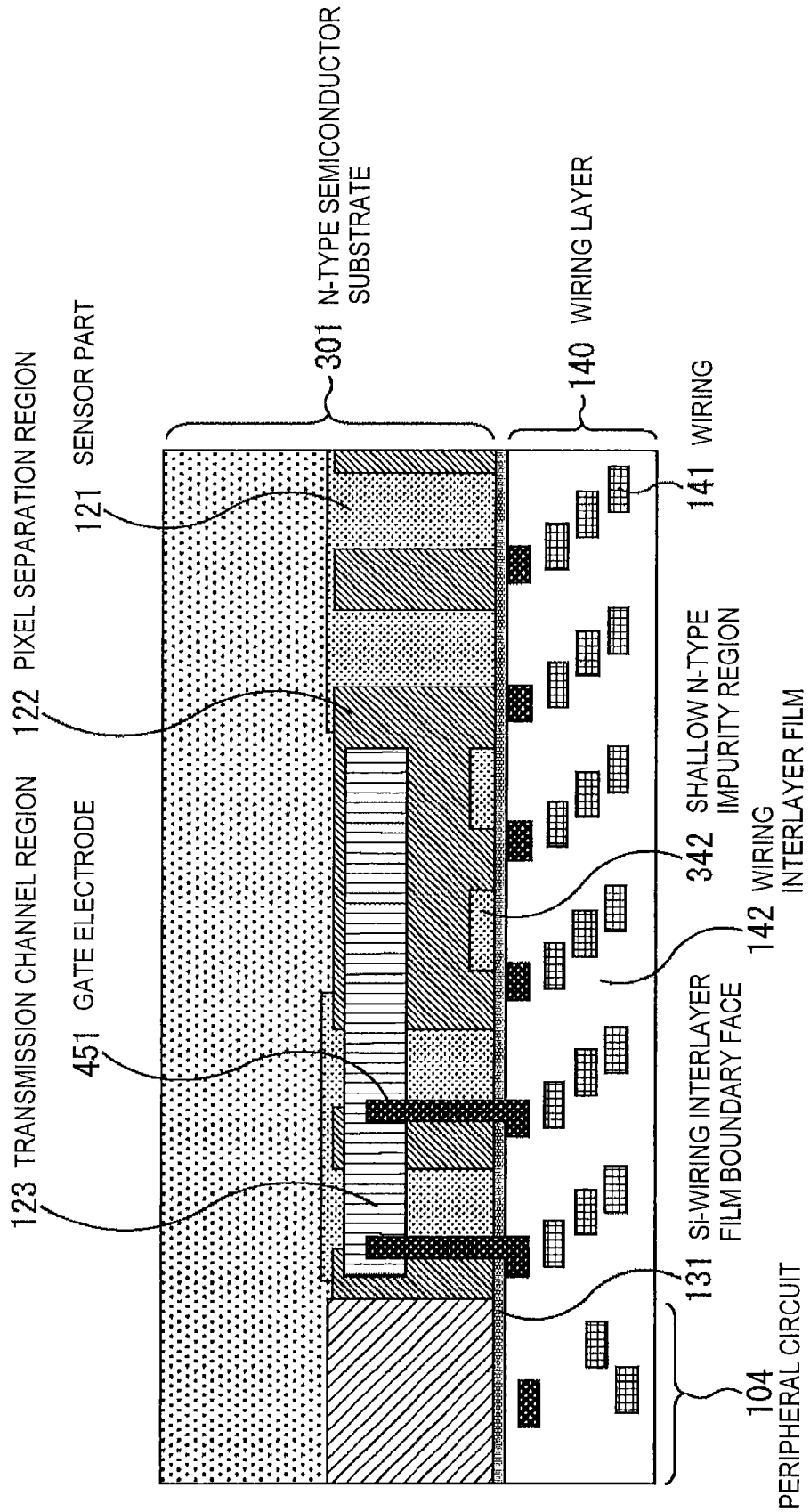
FIG. 18 is a diagram illustrating another configuration example of an imaging element to which the present technology is applied.

FIG. 18 illustrates a configuration example of the imaging element 100 in this case. In this case, a gate electrode 451 is embedded in the dummy pixel region 103 from the surface side of the semiconductor substrate 120 so as to reach the transmission channel region 123 as illustrated in FIG. 18

In such configuration, the imaging element 100 can easily draw an electron existing in a deep region via the gate electrode 451. Accordingly, the imaging element 100 can more accurately detect the black level reference value even in this case.

[Manufacturing]

Figure 19:
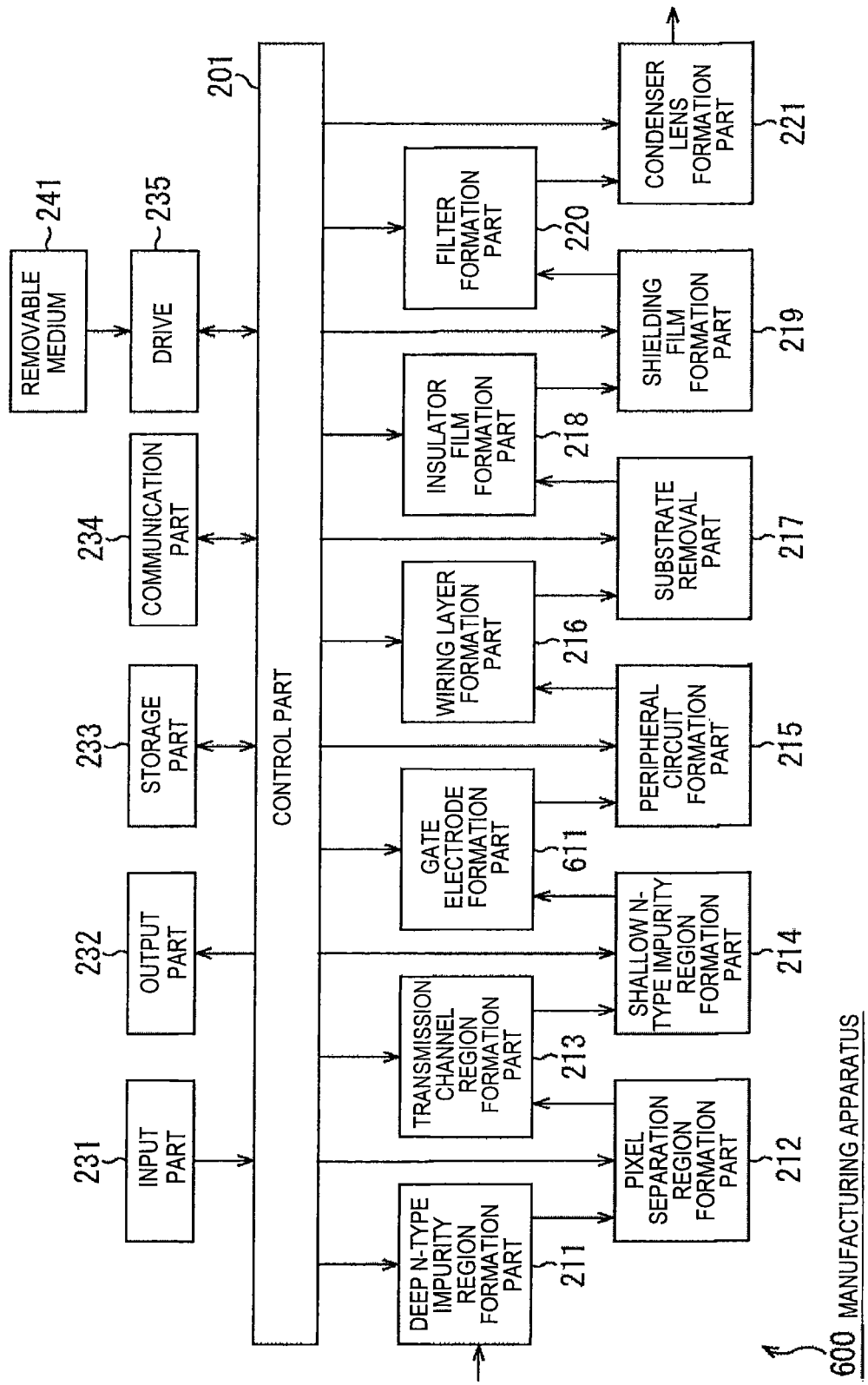
FIG. 19 is a block diagram illustrating further another configuration example of a manufacturing apparatus to which the present technology is applied.

FIG. 19 illustrates a configuration example of the manufacturing apparatus in this case. The manufacturing apparatus 600 illustrated in FIG. 19 is basically similar to the manufacturing apparatus 200, has a similar configuration and performs similar processes.

Note that, the manufacturing apparatus 600 further includes a gate electrode formation part 611.

Figure 20:
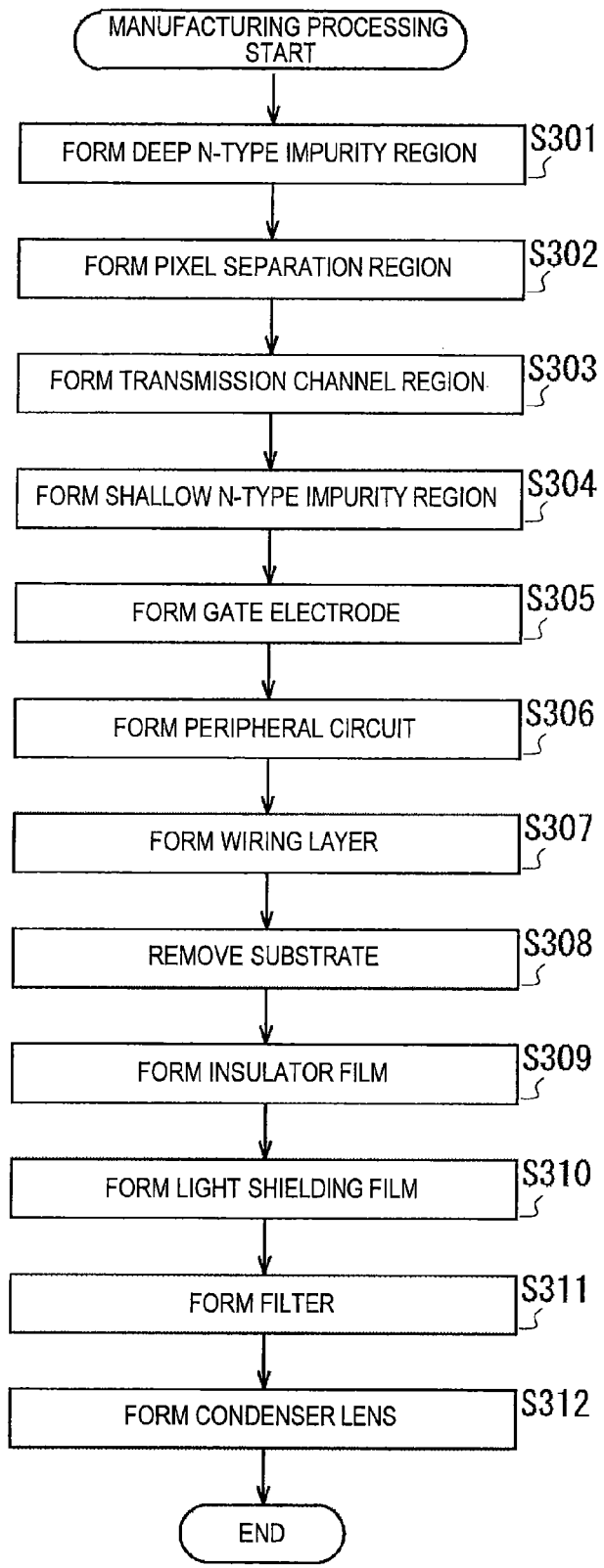
FIG. 20 is a flowchart explanatory of further another flow example of a manufacturing process.

A flow example of the manufacturing process in this case will be described with reference to a flowchart illustrated in FIG. 20.

Each of the processes in step S301 through step S304 is performed similarly to each of the processes in step S101 through step S104 illustrated in FIG. 7.

In step S105, the gate electrode formation part 611 forms a gate electrode 451 in the dummy pixel region 103 of the semiconductor substrate 120 under control of the control part 201.

Each of the processes in the following step S306 through step S312 is performed similarly to each of the processes in step S105 through step S111.

As described above, the manufacturing apparatus 600 can easily manufacture, without any special complex process, the imaging element 100 having a configuration as illustrated in FIG. 18 by performing each of the processes.

4. Fourth Embodiment

Imaging Element

Note that, the arrangement of the effective pixel region 101 through the peripheral circuit 104 is not limited to the example described with reference to FIG. 3. It is acceptable as long as another region such as the dummy pixel region 103 whose pixel value is not used is disposed next to the OB pixel region 102 disposed near the effective pixel region 101.

Figure 21:
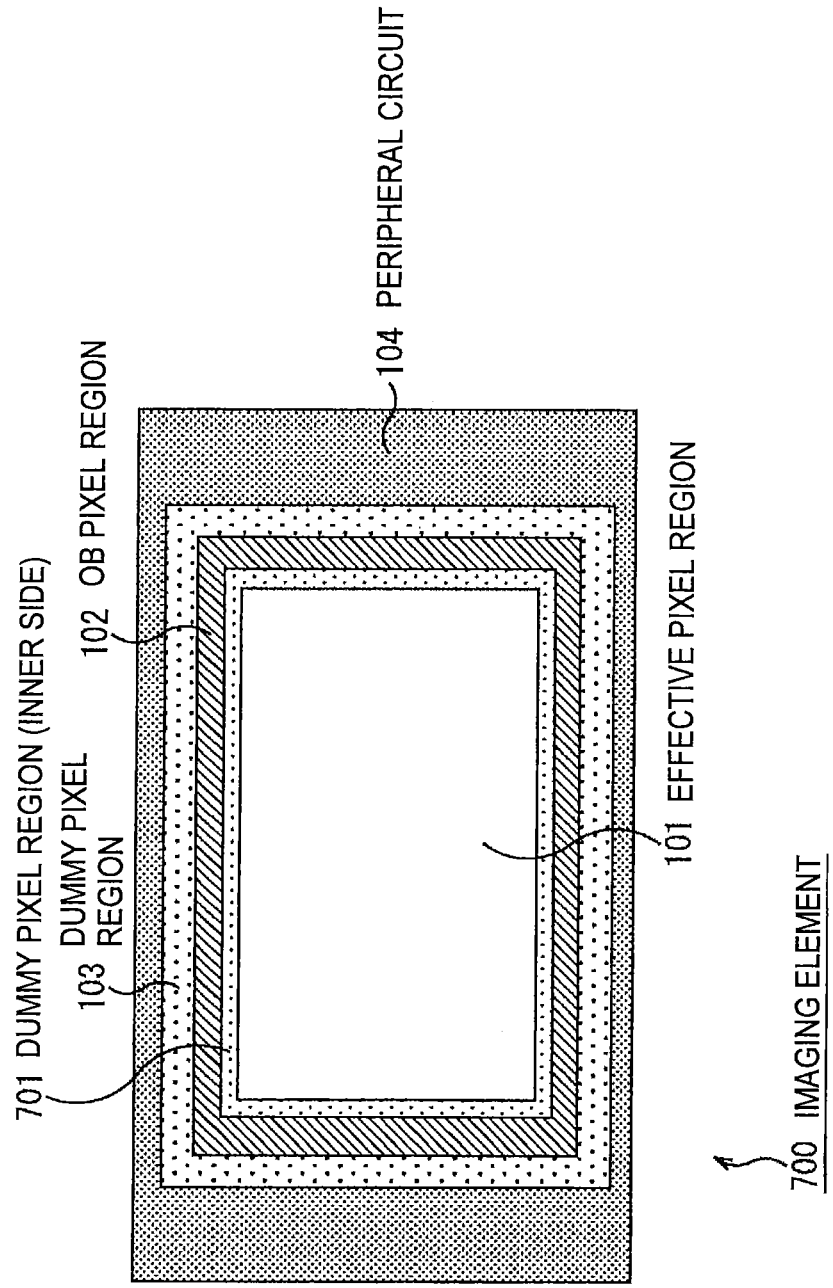
FIG. 21 is a diagram illustrating further another configuration example of an imaging element to which the present technology is applied.

For example, the dummy pixel region may be disposed on the inner side of the OB pixel region 102, that is, between the OB pixel region 102 and the effective pixel region 101 as illustrated in FIG. 21, and the transmission channel region may be formed toward the dummy pixel region.

The imaging element 700 illustrated in FIG. 21 basically has a configuration similar to that of the imaging element 100 but further has a dummy pixel region (inner side) 701 between the OB pixel region 102 and the effective pixel region 101. The dummy pixel region (inner side) 701 is a region similar to the dummy pixel region 103.

Figure 22:
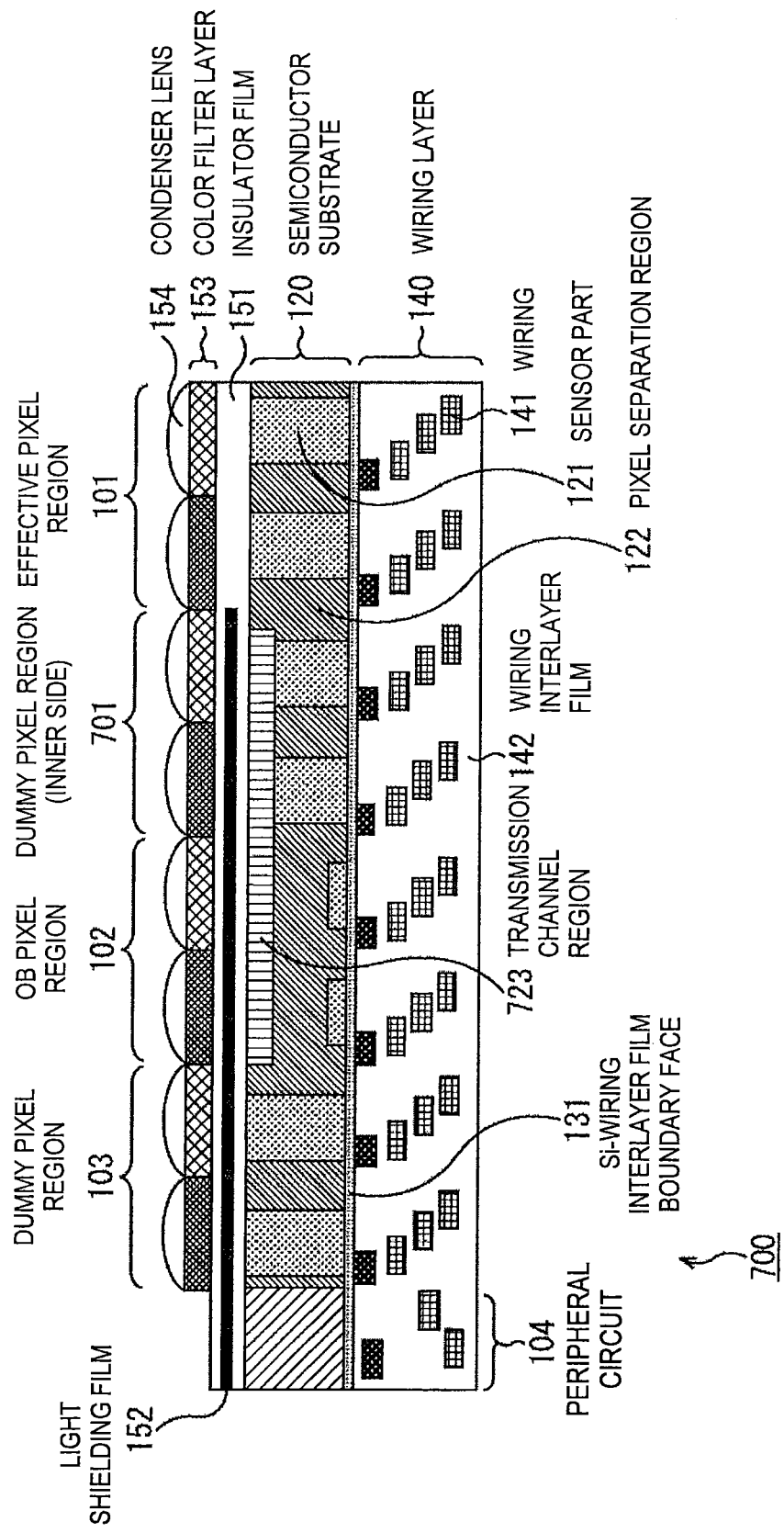
FIG. 22 is a diagram illustrating still further another configuration example of an imaging element to which the present technology is applied.

FIG. 22 is a cross-sectional view of the imaging element 700. The transmission channel region 723 is formed in the semiconductor substrate 120 from the OB pixel region 102 toward the dummy pixel region (inner side) 701 (not to the dummy pixel region 103) as illustrated in FIG. 22.

The potential gradient of the transmission channel region 723 is formed so as to lower as the gradient draws closer to the dummy pixel region (inner side) 701 side.

Other configurations are similar to those in the imaging element 100. Accordingly, the imaging element 700 can decrease possibility of charge storage in the sensor part 121 of the OB pixel region 102 because the charge entered the OB pixel region 102 is induced to the outside of the OB pixel region 102 through the transmission channel region 723. That is, the imaging element 700 can inhibit the deviation in pixel value of the OB pixel region 102 caused by the diffraction of light beams and detect a more accurate black level reference value.

Note that, the imaging element 700 can be manufactured in a process similar to that described in the first embodiment or in the second embodiment. Alternatively, a gate electrode may be provided in the dummy pixel region (inner side) 701 of the semiconductor substrate 120 as described above in the third embodiment above.

5. Fifth Embodiment

Image Pickup Apparatus

Figure 23:
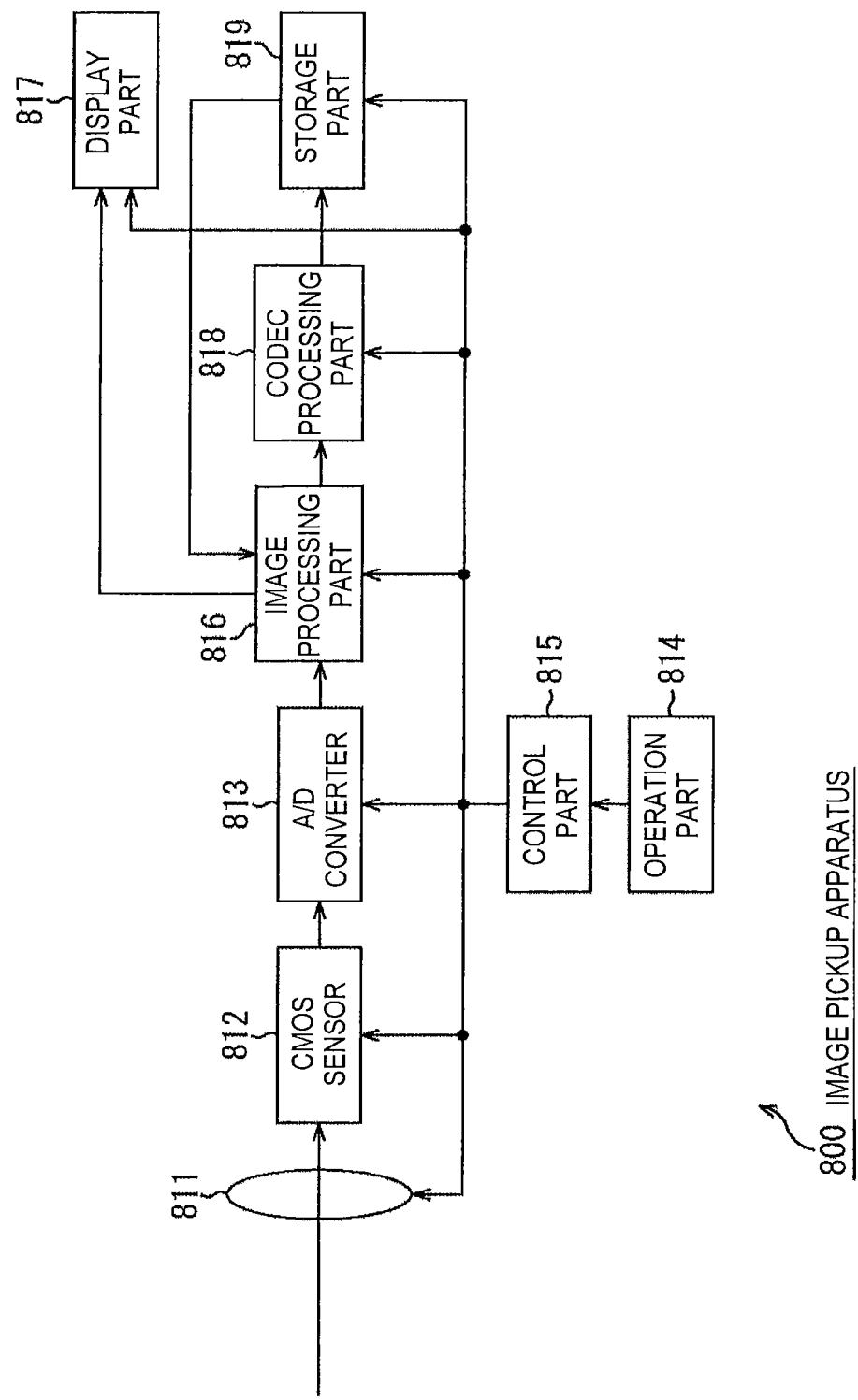
FIG. 23 is a diagram illustrating a major configuration example of an image pickup apparatus to which the present technology is applied.

FIG. 23 is a diagram illustrating a configuration example of an image pickup apparatus to which the present technology is applied. The image pickup apparatus 800 illustrated in FIG. 23 is an apparatus taking an image of a subject and outputting the image of the subject as electrical signals.

The image pickup apparatus 800 has, as illustrated in FIG. 23, a lens part 811, a CMOS sensor 812, an A/D converter 813, an operation part 814, a control part 815, an image processing part 816, a display part 817, a codec processing part 818 and a storage part 819.

The lens part 811 adjusts the focal point to the subject and condenses light beams from a focused position to supply the condensed light beams to the CMOS sensor 812.

The CMOS sensor 812 is a solid-state imaging element having the above-described structure and a transmission channel region is provided in the OB pixel region.

The A/D converter 813 converts a voltage signal with respect to each pixel supplied from the CMOS sensor 812 at a predetermined timing to a digital image signal (hereinafter, referred to as image signal as appropriate) and sequentially supplies the converted image signal to the image processing part 816 at a predetermined timing.

The operation part 814 includes a jog Dial™, a key and a button, or a touch panel or the like, and supplies a signal corresponding to a user operation input upon receiving the operation input to the control part 815.

The control part 815 controls driving of the lens part 811, the CMOS sensor 812, the A/D converter 813, the image processing part 816, the display part 817, the codec processing part 818 and the storage part 819 based on a signal corresponding to a user operation input performed at the operation part 814, and causes each of the parts to perform processes relevant to image pickup.

The image processing part 816 performs various kinds of image processing such as black level correction, color mixing correction, error correction, a demosaic process, a matrix process, gamma correction and YC conversion to the image signal supplied from the A/D converter 813. The image processing part 816 supplies image signals on which image processing is performed to the display part 817 and the codec processing part 818.

The display part 817 includes a liquid crystal display, for example, and displays an image of a subject based on the image signals supplied from the image processing part 816.

The codec processing part 818 performs an encoding process of a predetermined method on the image signals supplied from the image processing part 816 and supplies the image data obtained as a result of the encoding process to the storage part 819.

The storage part 819 stores the image data supplied from the codec processing part 818. When the image processing part 816 reads out the image data stored in the storage part 819 as appropriate, the image data is supplied to the display part 817 and a corresponding image is displayed.

The CMOS sensor 812 of the image pickup apparatus 800 can improve robustness against the diffraction of light beams as described above and more accurately detect the black level. Accordingly, the image processing part 816 can more appropriately perform a clamp process.

Note that, the image pickup apparatus having the solid-state imaging element and the image processing part to which the present technology is applied may have not only the above-described configuration but may have another configuration.

In the case where the above-described series of processing is performed based on software, the program included in the software is installed over a network or from a storage medium.

The storage medium includes, for example, the removable medium 241 (FIG. 6, FIG. 14 and FIG. 19) storing the program, which is distributed for delivering the program to a user independently from the apparatus. The removable medium 241 includes a magnetic disk (including flexible disk) and an optical disk (including CD-ROM and DVD), and further includes a magneto optical disk (including MD (Mini Disc)), a semiconductor memory and the like. Alternatively, besides the removable medium 241, the above-described storage medium may include ROM in the control part 201 (FIG. 6, FIG. 14 and FIG. 19) for storing the program, which is distributed to the user in the form of being preliminarily installed in the apparatus, and a hard disk included in the storage part 233 (FIG. 6, FIG. 14 and FIG. 19).

It should be noted that the program executed by a computer may be a program that is processed in time series according to the sequence described in this specification or a program that is processed in parallel or at necessary timing such as upon calling.

It should be also noted that, in this specification, the steps describing the program stored in the recording medium include not only a process performed in time series according to the sequence shown therein but also a process executed in parallel or individually, not necessarily performed in time series.

Further, in this specification, "system" refers to a whole device composed of a plurality of devices.

Further, an element described as a single device (or processing unit) above may be configured as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same. In other words, an embodiment of the disclosure is not limited to the embodiments described above, and various changes and modifications may be made without departing from the scope of the disclosure.

Additionally, the present technology may also be configured as below.

(1) An imaging element including:

a transmission channel region provided in an optical black pixel region shielded from light from an outside of a semiconductor substrate by a light shielding film, for transmitting a charge existing inside the semiconductor substrate of the optical black pixel region to an outside of the optical black pixel region.

(2) The imaging element according to (1), wherein the transmission channel region is an N-type region.
(3) The imaging element according to (1) or (2), wherein the transmission channel region is formed so as not to touch a photoelectric conversion element provided in the optical black pixel region.
(4) The imaging element according to any one of (1) to (3), wherein the photoelectric conversion element provided in the optical black pixel region is formed near a boundary face of the semiconductor substrate to be thinner than a photoelectric conversion element provided in an effective pixel region.
(5) The imaging element according to any one of (1) to (4), wherein a potential gradient is formed in the transmission channel region such that potential lowers along a horizontal direction from an inside of the optical black pixel region toward the outside of the optical black pixel region.
(6) The imaging element according to any one of (1) to (5), wherein the transmission channel region is formed so as to transmit the charge to a photoelectric conversion element of a pixel in a dummy pixel region whose pixel output is not used and disposed next to the optical black pixel region.
(7) The imaging element according to (6), wherein the dummy pixel region is disposed on an outer side of the optical black pixel region of the imaging element.
(8) The imaging element according to (6) or (7), wherein the dummy pixel region is disposed on an inner side of the optical black pixel region of the imaging element.
(9) The imaging element according to any one of (6) to (8), further including a gate electrode extending from a boundary face of the semiconductor substrate and reaching the transmission channel region in the dummy pixel region.
(10) The imaging element according to any one of (1) to (9), wherein the optical black pixel region is provided near an effective pixel region.
(11) An image pickup apparatus including:
an imaging element having a transmission channel region provided in an optical black pixel region shielded from light from an outside of a semiconductor substrate by a light shielding film, for transmitting a charge existing inside the semiconductor substrate of the optical black pixel region to an outside of the optical black pixel region.
(12) A manufacturing apparatus including:
a transmission channel region formation part forming a transmission channel region provided in an optical black pixel region shielded from light from an outside of a semiconductor substrate by a light shielding film in the semiconductor substrate, for transmitting a charge existing inside the semiconductor substrate of the optical black pixel region to an outside of the optical black pixel region.
(13) The manufacturing apparatus according to (12), wherein the transmission channel region formation part forms the transmission channel region in the semiconductor substrate by applying a resist to a boundary face of the semiconductor substrate on a surface side, forming a resist opening region at a predetermined position, and implanting an N-type impurity.
(14) The manufacturing apparatus according to (13), wherein the transmission channel region formation part implants the N-type impurity at a depth that the formed transmission channel region does not touch a photoelectric conversion element in the optical black pixel region.
(15) The manufacturing apparatus according to (13) or (14), wherein the transmission channel region formation part implants the N-type impurity having a concentration sufficient to invert a P-type impurity in a pixel separation region of the semiconductor substrate to an N-type impurity.
(16) The manufacturing apparatus according to (12), wherein the transmission channel region formation part forms the transmission channel region in the semiconductor substrate by implanting the N-type impurity from a rear face side of the semiconductor substrate after forming an insulator film on the rear face side of the semiconductor substrate.
(17) A manufacturing method of a manufacturing apparatus including:
forming, by a transmission channel region formation part, a transmission channel region provided in an optical black pixel region shielded from light from an outside of a semiconductor substrate by a light shielding film in the semiconductor substrate, for transmitting a charge existing inside the semiconductor substrate of the optical black pixel region to an outside of the optical black pixel region.

The present disclosure contains subject matter related to that disclosed in Japanese Priority Patent Application JP 2011-208512 filed in the Japan Patent Office on Sep. 26, 2011, the entire content of which is hereby incorporated by reference.

What is claimed is:

1. An imaging element comprising:
a transmission channel region provided in an optical black pixel region shielded from light from an outside of a semiconductor substrate by a light shielding film, for transmitting a charge existing inside the semiconductor substrate of the optical black pixel region to an outside of the optical black pixel region,
wherein the photoelectric conversion element provided in the optical black pixel region is formed near a boundary face of the semiconductor substrate to be thinner than a photoelectric conversion element provided in an effective pixel region.

2. The imaging element according to claim 1, wherein the transmission channel region is an N-type region.

3. The imaging element according to claim 1, wherein the transmission channel region is formed so as not to touch a photoelectric conversion element provided in the optical black pixel region.

4. The imaging element according to claim 1, wherein the transmission channel region is formed so as to transmit the charge to a photoelectric conversion element of a pixel in a dummy pixel region whose pixel output is not used and disposed next to the optical black pixel region.

5. The imaging element according to claim 4, wherein the dummy pixel region is disposed on an outer side of the optical black pixel region of the imaging element.

6. The imaging element according to claim 4, wherein the dummy pixel region is disposed on an inner side of the optical black pixel region of the imaging element.

7. The imaging element according to claim 4, further comprising a gate electrode extending from a boundary face of the semiconductor substrate and reaching the transmission channel region in the dummy pixel region.

8. The imaging element according to claim 1, wherein the optical black pixel region is provided near an effective pixel region.

9. An imaging element comprising:
a transmission channel region provided in an optical black pixel region shielded from light from an outside of a semiconductor substrate by a light shielding film, for transmitting a charge existing inside the semiconductor substrate of the optical black pixel region to an outside of the optical black pixel region,
wherein a potential gradient is formed in the transmission channel region such that potential lowers along a horizontal direction from an inside of the optical black pixel region toward the outside of the optical black pixel region.

10. A manufacturing apparatus comprising:
a transmission channel region formation part forming a transmission channel region provided in an optical black pixel region shielded from light from an outside of a semiconductor substrate by a light shielding film in the semiconductor substrate, for transmitting a charge existing inside the semiconductor substrate of the optical black pixel region to an outside of the optical black pixel region,
wherein the transmission channel region formation part forms the transmission channel region in the semiconductor substrate by applying a resist to a boundary face of the semiconductor substrate on a surface side, forming a resist opening region at a predetermined position, and implanting an N-type impurity, and
the transmission channel region formation part implants the N-type impurity having a concentration sufficient to invert a P-type impurity in a pixel separation region of the semiconductor substrate to an N-type impurity.

11. The manufacturing apparatus according to claim 10, wherein the transmission channel region formation part implants the N-type impurity at a depth that the formed transmission channel region does not touch a photoelectric conversion element in the optical black pixel region.

12. The manufacturing apparatus according to claim 10, wherein the transmission channel region formation part forms the transmission channel region in the semiconductor substrate by implanting the N-type impurity from a rear face side of the semiconductor substrate after forming an insulator film on the rear face side of the semiconductor substrate.

* * * * *